United States Patent [19]

Kamon

[11] Patent Number: 5,367,358
[45] Date of Patent: Nov. 22, 1994

[54] PROJECTION EXPOSING APPARATUS AND PROJECTION EXPOSING METHOD

[75] Inventor: Kazuya Kamon, Itami, Japan

[73] Assignee: Mitsubishi Denki Kabushiki Kaisha, Tokyo, Japan

[21] Appl. No.: 131,969

[22] Filed: Oct. 8, 1993

[30] Foreign Application Priority Data

Oct. 9, 1992 [JP] Japan .................................. 4-271972
Jul. 23, 1993 [JP] Japan .................................. 5-182659

[51] Int. Cl.$^5$ ........................ G03B 27/72; G03B 27/42
[52] U.S. Cl. ........................................ 355/71; 355/53; 355/67
[58] Field of Search ............................. 355/53, 67, 71; 362/268; 359/619

[56] References Cited

U.S. PATENT DOCUMENTS

| | | | |
|---|---|---|---|
| 5,144,362 | 9/1992 | Kamon et al. | 355/53 |
| 5,160,962 | 11/1992 | Miura et al. | 355/53 |
| 5,251,067 | 10/1993 | Kamon | 359/628 |
| 5,253,040 | 10/1993 | Kamon et al. | 356/399 |
| 5,264,898 | 11/1993 | Kamon et al. | 355/67 |
| 5,287,142 | 2/1994 | Kamon | 355/53 |
| 5,300,967 | 4/1994 | Kamon | 353/97 |
| 5,300,971 | 4/1994 | Kudo | 355/67 |
| 5,300,972 | 4/1994 | Kamon | 355/71 |
| 5,311,249 | 5/1994 | Kamon et al. | 355/71 |

*Primary Examiner*—Richard A. Wintercorn
*Attorney, Agent, or Firm*—Leydig, Voit & Mayer

[57] ABSTRACT

A projection exposing apparatus has a second photo-mask disposed on a blind for determining a region to be exposed to deformed light beams, the circuit pattern of the second photo-mask being the same as or arranged to correspond to the circuit pattern of a first photo-mask to be projected onto a substrate The deformed irradiation light beams are applied to the second photo-mask circuit pattern to image diffracted light beams on the substrate and project the circuit pattern.

18 Claims, 44 Drawing Sheets

PROJECTION EXPOSING APPARATUS AND PROJECTION EXPOSING METHOD

BACKGROUND OF THE INVENTION

1. Field of the Invention

The present invention relates to a projection exposing apparatus and a projection exposing method which forms, on a wafer, a precise pattern that is required to manufacture a large scale integrated circuit (LSI).

2. Description of the Related Art

FIG. 37 illustrates an optical system of a conventional projection exposing apparatus. In the projection exposing apparatus, a fly-eye lens 13 and a mirror 12 are disposed in front of a light source 11 which serves as a lamp house. An aperture member 14 is disposed in front of the fly-eye lens 13, the aperture member 14 having a circular aperture 14a formed the central portion thereof. Further, an exposing mask 18, on which a desired pattern is formed, is disposed in of the aperture member 14 with a blind 15 for determining an exposing range, converging lenses 16a, 16b, 16c, and a mirror 17 between the mask 18 and the aperture member 14. A wafer 20, which is a substrate be exposed to light, is disposed in front of the mask 18 with projection lens systems 19a, 19b and a projection lens pupil 22 between the mask 18 and the wafer 20.

Light beams supplied from the light source 10 reach the fly-eye lens 13 by way of the mirror 12, the light beams being then distributed to respective lenses 13a that constitute the fly-eye lens 13. The light beams, passed through the respective lenses 13a, are passed through the aperture portion 14a, the converging lens 16a, the blind 15, the converging lens 16b, the mirror 17 and the converging lens 16c so that all of the mask is irradiated with the light beams. Therefore, light beams, passed through the respective lenses 13a of the fly-eye lens 13, are superimposed on one another on the surface of the mask 18, and therefore, uniform irradiation is achieved. The light beams, passed through the mask 18 as described above, are passed through the projection lens system 22 composed of the projection lens 19a, the pupil 19b and a lens 19c, so that the light beams reach the wafer 20. As a result, a precise circuit pattern is printed on a resist film on the surface of the wafer 20.

FIGS. 38 to 45 respectively are views which further schematically illustrate the conventional projection exposing apparatus shown in FIG. 37 and its modifications for various purposes. The corresponding elements are given the same or corresponding reference numerals. The structures shown in FIGS. 38 to 45 comprise the following elements that are arranged individually: a first aperture 14 so irradiated by the light source 11 (see FIG. 37) as to be a second flight source surface, a photo-mask 18 having a precise pattern and an optical image 23 on a wafer 20. However, the structures commonly comprise the following elements: a blind surface 15 for determining the region to be exposed to the irradiation light beams, a second aperture 21 formed in the mirror 17 shown in FIG. 37 and serving as a third light source surface, and a projection optical system 22 that images diffracted light beams passed from a photo-mask 18 on an exposing substrate 20 to project a circuit pattern 23.

In the projection exposing apparatus shown in FIG. 38, the first aperture 14 irradiated by the light source (see FIG. 37) forms usual irradiation light beams, the photo-mask 18 is a Levenson-type phase-shift mask, and the pattern 18a is a precise pattern. In the projection exposing apparatus shown in FIG. 38, light beam L passed through the first aperture 14, which is the second light source surface, is passed through the blind surface 15 and the second aperture 21 so that the photo-mask 18 is irradiated with the light beam L. Since the photo-mask 18 is the Levenson-type phase-shift mask, no 0-order diffracted light beam is generated but ±1-order diffracted light beams L1 and L-1 are generated. Further, the angle of diffraction is relatively small. The diffracted light beams are passed through the pupil of the projection optical system 22, and are incident on the wafer 20 at a relatively small angle, causing an optical image 23a to be formed. Therefore, both resolution and the depth of focus are large enough such that they are twice those of the projection exposing apparatus shown in FIG. 39, causing a satisfactory practicality to be realized.

In the projection exposing apparatus shown in FIG. 39, the first aperture 14 forms usual irradiation light beams, and the photo-mask 18 is a usual mask having a precise pattern 18b. In the projection exposing apparatus shown in FIG. 39, light beam L passed from the first aperture, which is the second light source surface, is passed through the blind 15 and the second aperture 21 so that the photo-mask 18 is irradiated with the light beam L. Since the pattern of the photo-mask 18 is formed precisely, diffracted light beams L1 and L-1 are diffracted while respectively making large angles. The diffracted light beams L1 and L-1 are passed through the periphery of the pupil of the projection optical system 22, and incident on the wafer 20 at relatively large angles so that an optical image 23b is formed. Therefore, the resultant depth of focus and the resolution are unsatisfactory, causing a problem to arise in practicality.

In the projection exposing apparatus shown in FIG. 40, the first aperture 14 forms usual irradiation light beams, and the photo-mask 18 is a usual mask having a coarse pattern 18c. In the projection exposing apparatus shown in FIG. 40, light beam L passed from the first aperture 14, which is the second light source surface, is passed through the blind 15 and the second aperture 21 so that the photo-mask 18 is irradiated with the light beam L. Since the pattern 18c of the photo-mask 18 is formed coarsely, the diffracted light beams L1 and L-1 respectively make small angles. The diffracted light beams L1 and L-1 are passed through the central portion of the pupil of the projection optical system 22, and are incident on the wafer 20 at relatively small angles from the wafer 20. As a result, an optical image 23c is formed. Therefore, satisfactory depth of focus and resolution can be realized, and therefore, the apparatus shown in FIG. 40 can be used practicably.

In the projection exposing apparatus shown in FIG. 41, the first aperture 14 forms usual irradiation light beams, and the photo-mask 18 is a usual mask having isolated pattern 18d which is formed regardless of the pattern size. In the projection exposing apparatus shown in FIG. 41, light beam L passed from the first aperture, which is the second light source surface, is passed through the blind surface 15 and the second aperture 21 so that the photo-mask 18 is irradiated with the light beam L. Since the photo-mask 18 is an isolated pattern, no optical image can be obtained on the pupil surface of the projection optical system 22 but a Gaussian-distributed diffracted light beam LG is obtained. As a result, an optical image 23d is formed on the wafer 20. The depth of focus and the resolution, which are determined depending upon the spread of the diffracted light beam G, are satisfactory.

As described above, the usual irradiation causes a problem when the usual mask having the precise pattern as shown in FIG. 39 is used. However, use of each of the masks having the patterns as shown in FIGS. 38, 40 and 41 enables a practical exposure to be performed.

In the projection exposing apparatus shown in FIG. 42, the first aperture 14 irradiated with the light source 11 (see FIG. 37) has a light-shielding member 24 to form deformed irradiation light beams. The photo-mask 18 is a Levenson-type phase shift mask having the pattern 18a formed into a precise pattern. In the projection exposing apparatus shown in FIG. 42, light beam L passed from the first aperture 14, which is the second light source surface, is passed through the blind surface 15 and the second aperture 21, which is the third light source surface, so that the photo-mask 18 is diagonally irradiated with the light beam L. Since the photo-mask 18 is a Levenson-type phase shift mask, no 0-order light beam is generated but ±1-order diffracted light beams are generated. The +1-order diffracted light beam L1 is blocked by the pupil of the projection optical system 22, while only the −1-order diffracted light beam L-1 is passed through the pupil and reaches the wafer 20. However, the fact, that only the −1-order diffracted light beam L-1 reaches the wafer 20, causes no interference of the diffracted light beams to occur. As a result, the optical image 23a cannot be formed, and therefore, the foregoing structure cannot be used as a practical apparatus.

In the projection exposing apparatus shown in FIG. 43, the first aperture 14 forms deformed irradiation light beams, and the photo-mask 18 is a usual mask having the precise pattern 18b. In the projection exposing apparatus shown in FIG. 43, light beam L passed from the first aperture, which is the second light source surface, is passed through the blind 15 and the second aperture 21, which is the third light source surface, so that the photo-mask 18 is diagonally irradiated with the light beam L that has a certain incidental angle. Since the pattern 23b of the photo-mask 18 is formed precisely, the diffracted light beams are diffracted while making a large angle. Therefore, +1-order diffracted light L1 is blocked by the pupil of the projection optical system 22, while 0-order diffracted light beam L0 and −1-order diffracted light beam L-1 are passed through the periphery of the pupil to be incident on the wafer 20, causing an optical image to be formed on the wafer 20. Since the incidental angles (the effective incidental angles) of the 0-order and −1-order diffracted light beams on the wafer 20 are small, excellent depth of focus and resolution can be obtained. Therefore, a satisfactorily practical apparatus can be realized.

In the projection exposing apparatus shown in FIG. 44, the first aperture 14 forms deformed irradiation light beams, and the photo-mask 18 is a usual mask having the coarse pattern 18c. In the projection exposing apparatus shown in FIG. 44, light beams passed from the first aperture 14, which is the second light source surface, are passed through the blind surface 15 and the second aperture 21 while making a certain angle, the second aperture 21 being the third light source surface. The +1-order diffracted light beam is passed through the periphery of the pupil of the projection optical system 22, while the 0-order diffracted light beam and the −1-order diffracted light beams are passed through the central portion of the pupil and are incident on the wafer to form an optical image on the wafer 20. Since the light beams which are incident on the wafer 20 include the +1-order diffracted light beam, a large effective incidental angle is made, and therefore, the depth of focus and the resolution are reduced. As a result, the foregoing apparatus cannot be used practically.

In the projection exposing apparatus shown in FIG. 45, the first aperture 14 forms deformed irradiation light beams, and the photo-mask 18 is a usual mask having an isolated pattern 18d. In the projection exposing apparatus shown in FIG. 45, the light beams passed from the first aperture 14, which is the second light source surface, are passed through the blind 15 and the second aperture 21 while making a certain angle, the second aperture 21 being the third light source surface. Thus, the photo-mask 18 is diagonally irradiated with the light beam while making a certain incidental angle from the photo-mask 18. Since the pattern of the photo-mask 18 is an isolated pattern, no optical image is formed on the pupil surface of the projection optical system 22 but Gaussian-distributed diffracted light beams are obtained. The depth of focus and the resolution are determined depending upon the spread of the foregoing diffracted light beams. Since the most intense portion of the distributed light beams is deviated from the central portion and widened in the periphery, the effective incidental angle is enlarged. Therefore, the resultant depth of focus and the resolution are too small to cause the apparatus shown in FIG. 45 to be used practically.

As described above, the deformed light beam irradiation enables adequate exposure when the usual mask having the precise pattern shown in FIG. 43 is used. However, the deformed light beam irradiation cannot be used preferably when masks having the patterns shown in FIGS. 42, 44 and 45 are used.

As described above, the conventional projection exposing apparatus encounters a problem that adequate exposure using a precise pattern cannot be performed with the usual irradiation and exposure using a coarse pattern cannot be performed adequately with the deformed light beam irradiation. Therefore, in order to perform both exposure of a precise pattern and exposure of a coarse pattern in one conventional projection and exposing apparatus, the first aperture and the photo-mask must be changed to convert the usual irradiation to the deformed light beam irradiation while also changing the size and the shape of the pupil.

SUMMARY OF THE INVENTION

The present invention is directed to overcome the foregoing problems, and therefore, an object of the present invention is to provide a projection exposing apparatus that is adaptable to both a precise pattern and a coarse pattern through changing only a photo-mask and no other elements.

Another object of the present invention is to provide a projection exposing method that is easily adaptable to both a precise pattern and a coarse pattern.

A projection exposing apparatus according to a first aspect of the present invention comprises: a light source; a first aperture that shapes light beams supplied from the light source to form a second light source surface for deformed irradiation; a blind having an aperture for determining an exposure region of light beams supplied from the second light source surface; a second aperture that shapes the light beams supplied from the second light source surface to form a third light source surface; a first photo-mask having a circuit pattern and irradiated with light beams supplied from the third light source surface; a projection optical system that images, onto a substrate to be exposed to light, diffracted light beams passed from the first photo-mask to project the circuit pattern of the first photo-mask; and a second photo-mask having a pattern corresponding to the circuit pattern of the first photo-mask and disposed in the aperture of the blind.

A projection exposing apparatus according to a second aspect of the present invention comprises: a light source; an aperture that shapes light beams supplied from the light source to form a second light source surface for deformed irradiation; a blind for determining an exposure region with light beams supplied from the second light source surface; a photo-mask having a circuit pattern and irradiated with the light beams supplied from the second light source surface; a first projection optical system that shapes diffracted light beams passed from the photo-mask to irradiate the photo-mask with the diffracted light beams which have been shaped; and a second projection optical system that images light beams diffracted by the photo-mask on to a substrate to project the circuit pattern of the photo-mask.

A projection exposing method according to a third aspect of the present invention comprises the steps of: shaping light beams supplied from a light source to form a second light source surface for deformed; irradiating, with irradiation light beams supplied from the second light source surface, a second photo-mask having a pattern corresponding to a circuit pattern of a first photo-mask and disposed on a blind surface; shaping the irradiation light beams shaped by the second photo-mask to form a third light source surface; irradiating the first photo-mask with light beams supplied from the third light source surface; and imaging diffracted light beams passed from the first photo-mask on to a substrate to project the circuit pattern of the first photo-mask.

A projection exposing method according to a fourth aspect of the present invention comprises the steps of shaping light beams supplied from a light source to form a second light source surface for deformed; irradiating, with irradiation light beams supplied from the second light source surface, a photo-mask having a circuit pattern; shaping diffracted light beams passed from the photo-mask and again irradiating the photo-mask with the diffracted light beams which have been shaped; and imaging light beams again diffracted by the photo-mask on to a substrate to project the circuit pattern of the photo-mask.

DESCRIPTION OF THE PREFERRED EMBODIMENT

Figure 1:
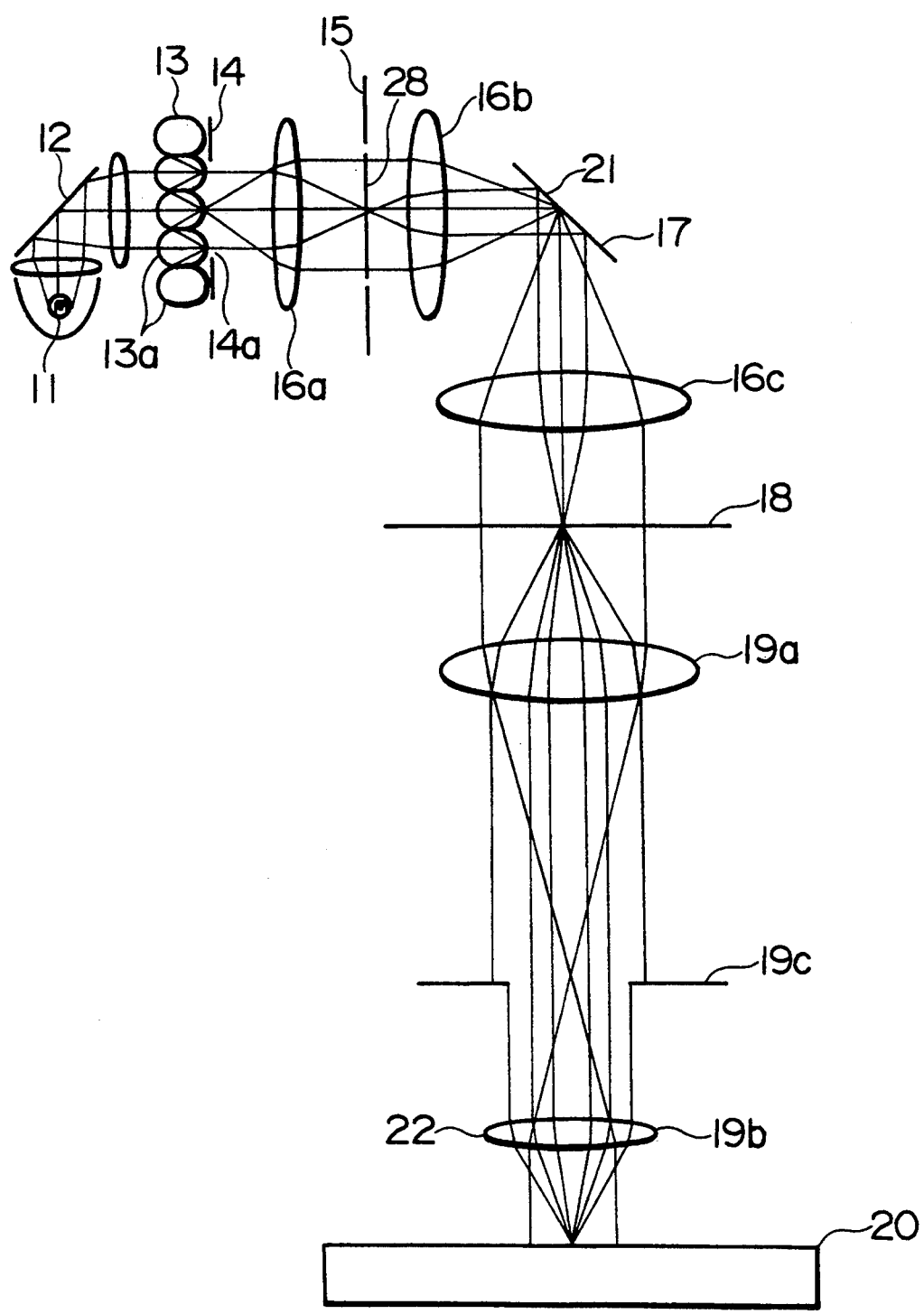
FIG. 1 illustrates the optical system of a projection exposing apparatus according to a first embodiment of the present invention.

FIG. 1 illustrates an optical system according to a first embodiment of the present invention. A fly-eye lens 13 and a mirror 12 are disposed in front of a light source 11 which serves as a lamp house. A first aperture member 14 having a circular aperture 14a formed in the central portion thereof is disposed in front of the fly-eye lens 13, the aperture member 14 to shape on the second light source surface, light beams which have been passed through the fly-eye lens 13. An exposing range determining blind 15, converging lenses 16a, 16b, 16c and a mirror 17 are disposed in front of the first aperture member 14. An exposing first-photo-mask 18 having a desired circuit pattern formed thereon is disposed in front of the converging lens 16c. A second aperture 21 for shaping on the third light source surface the light beams shaped by the first aperture member 14 is disposed on the mirror 17. Further, a wafer 20, which is a substrate to be exposed to light, is disposed in front of the first photo-mask with a projection lens system 22 composed of projection lenses 19a, 19b and a projection lens pupil 19c disposed between the wafer 20 and the first photo-mask 18.

In the projection exposing apparatus according to the first embodiment, deformed light beam irradiation is produced by an arrangement such that the first aperture 14 has a light shielding member 24 (see FIG. 2) in the central portion of the aperture 14a. Further, the projection exposing apparatus according to the first embodiment comprises a second photo-mask 28 disposed in the aperture of the blind 15, that is, on the surface of the blind 15, the second photo-mask 28 having the same pattern as that of the first photo-mask 18.

Light beams supplied from the light source 11 reach the fly-eye lens 13 by way of the mirror 12, the light beams being then distributed to respective lenses 13a that constitute the fly-eye lens 13. The light beams passed through the respective lenses 13a are formed into deformed irradiation light beams by a light shielding member 24 (see FIG. 2) disposed in the aperture 14a of the aperture member 14. The deformed irradiation light beams are passed through the converging lens 16a, the blind 15, the second photo-mask in the aperture of the blind 15, the converging lens 16b, the second aperture 21, the mirror 17 and the converging lens 16c so that the overall surface of the exposing region of the mask 18 is irradiated with the deformed irradiation light beams. Therefore, light beams passed through the respective lenses 13a of the fly-eye lens 13 are superimposed on one another on the surface of the mask 18, and therefore, uniform irradiation is performed. The light beams passed through the mask 18 as described above are passed through the projection lens system 22 composed of the projection lens 19a, the pupil 19c and the lens 19b, so that the light beams reach the wafer 20. As a result, a precise circuit pattern is printed on a resist film (omitted from illustration) on the surface of the wafer 20.

FIGS. 2 to 9 respectively are views which respectively further schematically illustrate the projection exposing apparatus according to the first embodiment shown in FIG. 1 and its modifications. The corresponding elements are given the same or corresponding reference numerals. The structures shown in FIGS. 2 to 9 comprise the following elements that are arranged individually: the first mask 18 having a circuit pattern, the second photo-mask 28 having the same circuit pattern as that of the first photo-mask 18 and an optical image on the wafer 20. The structures commonly comprise the following elements: the first aperture 14 to be irradiated by the light source 11 (see FIG. 1) as a second light source surface for forming deformed irradiation light beams, the blind 15 for determining the exposing region to be exposed to the irradiation light beams, the second aperture 21 disposed on the mirror 17 shown in FIG. 1 as a third light source surface, and the projection optical system 22 for imaging diffracted light beams passed from the first photo-mask 18 on the substrate 20 so that the circuit pattern is projected.

Figure 2:
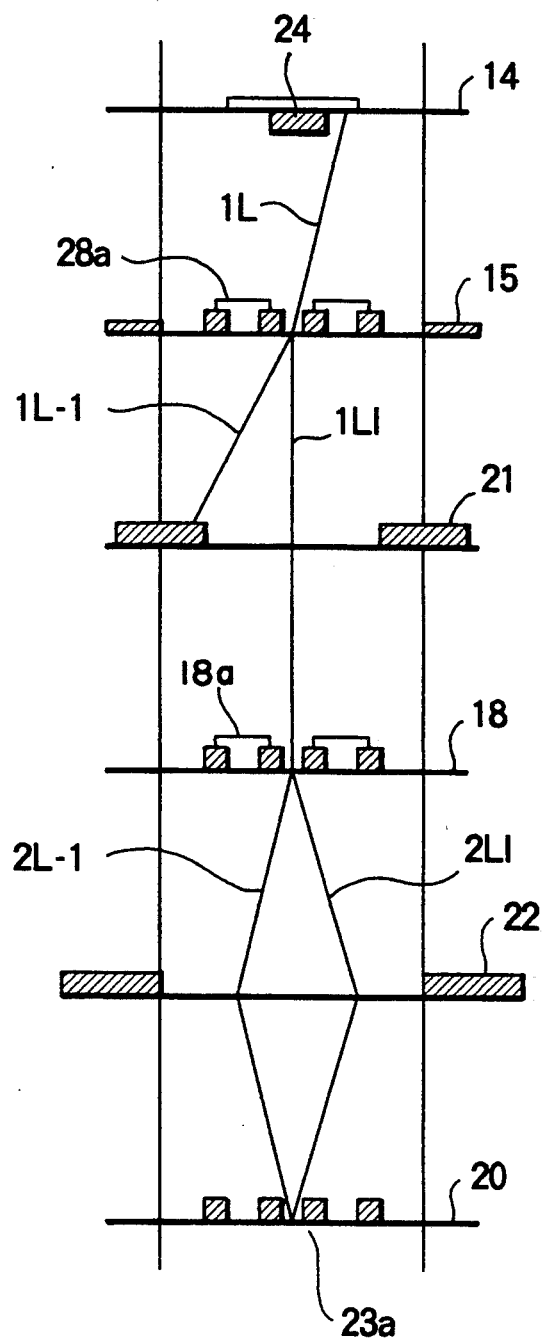
FIG. 2 is a schematic view which illustrates the principle, where a Levenson-type phase shift mask is employed, of the projection exposing apparatus shown in FIG. 1.

In the projection exposing apparatus shown in FIG. 2, the first aperture 14 to be irradiated by the light source 11 (see FIG. 1) has a light shielding member 24 to form deformed irradiation light beams. The first photo-mask 18 is a Levenson-type phase shift mask, and the pattern 18a is a precise pattern. Therefore, the second photo-mask on the blind 15 is also a Levenson-type phase shift mask similar to the first photo-mask 18. In the projection exposing apparatus shown in FIG. 2, the second photo-mask 28 on the surface of the blind with light beams 1L passed from the first aperture 14 which is the second light source surface. At this time, no 0-order diffracted light beam is generated due to diffraction, but ±1-order diffracted light beams IL1 and IL-1 each having a relatively small diffraction angle are generated. Among the foregoing diffracted light beams, the −1-order diffracted light beam 1L-1 is blocked by the second aperture 21 and the +1-order diffracted light 1L1 is passed through the second aperture 21 so that the first photo-mask 18 is irradiated. Since the first photo-mask 18 is the Levenson-type phase-shift mask, no 0-order diffracted light beam is generated, but ±1-order diffracted light beams 2L1 and 2L-1 are generated, while having relatively small angles of diffraction. The diffracted light beams 2L1 and 2L-1 are passed through the pupil of the projection optical system 22, and are incident on the surface of the wafer 20 at relatively small angles of incidence so that an optical image 23a is formed. Therefore, an excellent resolution and a sufficiently deep depth of focus can be realized, resulting in a satisfactory practicability.

Figure 3:
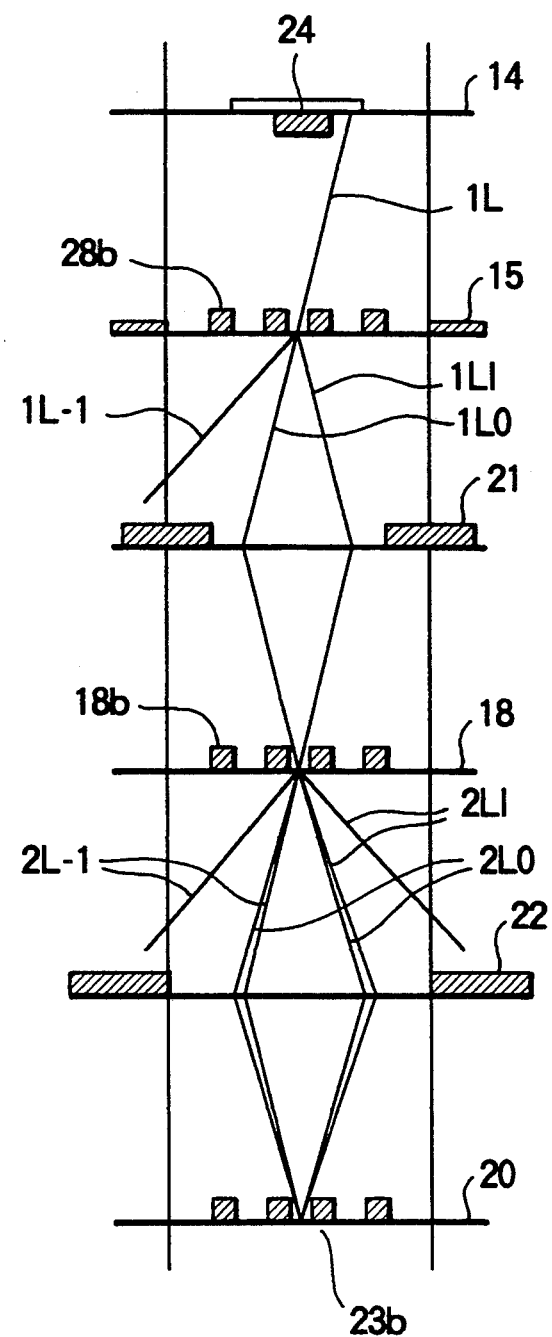
FIG. 3 is a schematic view which illustrates the principle, where a usual mask having a precise pattern is employed, of the projection exposing apparatus shown in FIG. 1.

In the projection exposing apparatus shown in FIG. 3, the first aperture 14 forms deformed irradiation light beams. Further, the first photo-mask 18 and the second photo-mask 28 are usual masks having precise patterns 18b and 28b. In the projection exposing apparatus shown in FIG. 3, light beam 1L passed from the first aperture 14, which is the second light source surface of the deformed light beam irradiation, is applied to irradiate the second pattern 28b of the blind 15, the light beam 1L being then diffracted. Among the foregoing light beams, the 1-order and 0-order diffracted light beams 1L1 and 1L0 are passed through the second aperture 21 so that the first photo-mask 18 is irradiated. The −1-order diffracted light beam 1L-1 is blocked by the second aperture 21. Since the pattern of the first photo-mask 18 is formed into a precise shape, the 1-order, 0-order and −1-order diffracted light beams 2L1, 2L0 and 2L-1 are diffracted at large angles. Among the foregoing diffracted light beams, peripheral light beams are shielded by the pupil of the projection optical system 22. On the other hand, the inner diffracted light beams are passed through the central portion of the pupil of the projection optical system 22, and made incident on the surface of the wafer 20 while making relatively small angles with the wafer 20 so that an optical image 23b is formed. Therefore, an excellent resolution and a sufficiently deep depth of focus can be realized, resulting in a satisfactory practicability.

Figure 4:
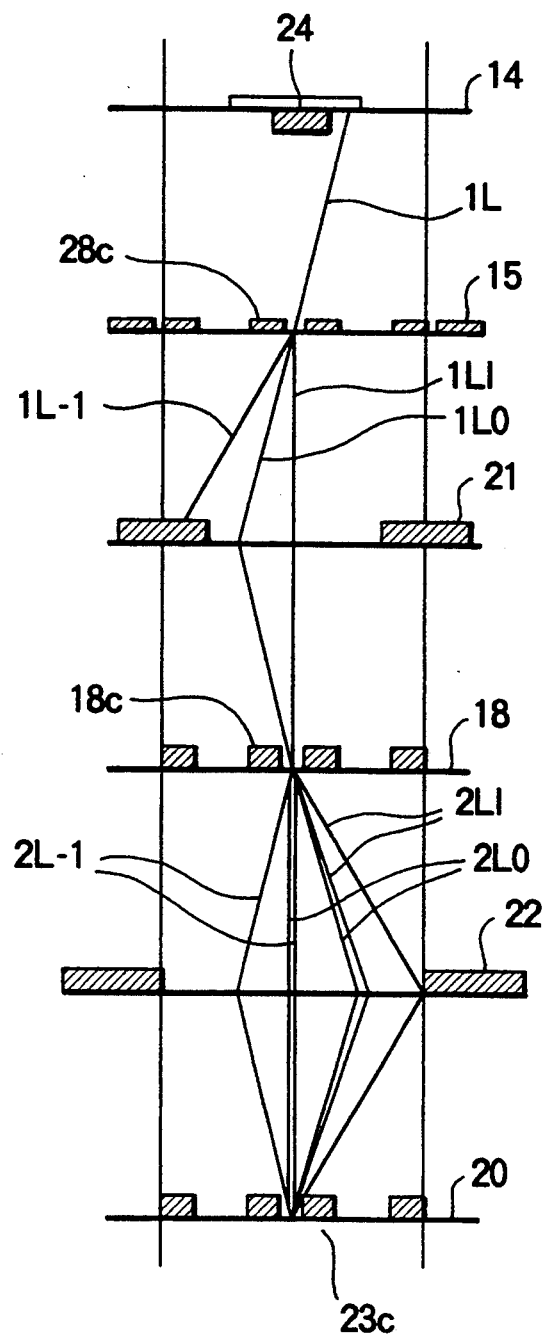
FIG. 4 is a schematic view which illustrates the principle, where a usual mask having a coarse pattern is employed, of the projection exposing apparatus shown in FIG. 1.

In the projection exposing apparatus shown in FIG. 4, the first aperture 14 forms deformed irradiation light beams. Further, the first photo-mask 18 is a usual mask having a coarse pattern 18c, and also the second photo-mask 28 is a usual mask having a coarse pattern 28c. In the projection exposing apparatus shown in FIG. 4, light beam 1L passed from the first aperture 14, which is the second light source surface, is passed through the second photo-mask 28 of the blind 15 to be diffracted and formed into light beams 1L1, 1L0 and 1L-1. Among the foregoing diffracted beams, the −1-order diffracted light beam 1L-1 is shielded by the second aperture 21. On the other hand, the 1-order diffracted light beam 1L1 and the 0-order diffracted light beam 1L0 are passed through the second aperture 21 so that the first photo-mask 18 is irradiated. Since the pattern of the second photo-mask 28 is the coarse pattern 28c, the diffracted light beams from the second photo-mask 28 are not widened considerably at this time, and therefore, the light beams are able to reach the central portion of the third light source surface 21. As a result, the deformed light beam irradiation realized by the second light source surface 14 is converted into usual irradiation by the third light source surface 21. The first photo-mask 18 is irradiated by the third light source surface 21 which has been converted into the usual irradiation. Since the pattern 18c of the first photo-mask 18 is a coarse pattern, each of the diffracted light beams 2L1, 2L0 and 2L-1 has a small angle of diffraction. The diffracted light beams 2L1, 2L0 and 2L-1 are passed through substantially the central portion of the pupil of the projection optical system 22 and made incident on the surface of the wafer 20 at relatively small angles of incidence so that an optical image 23c is formed. Therefore, an excellent resolution and a sufficiently deep depth of focus can be realized, resulting in a satisfactory practicability.

Figure 5:
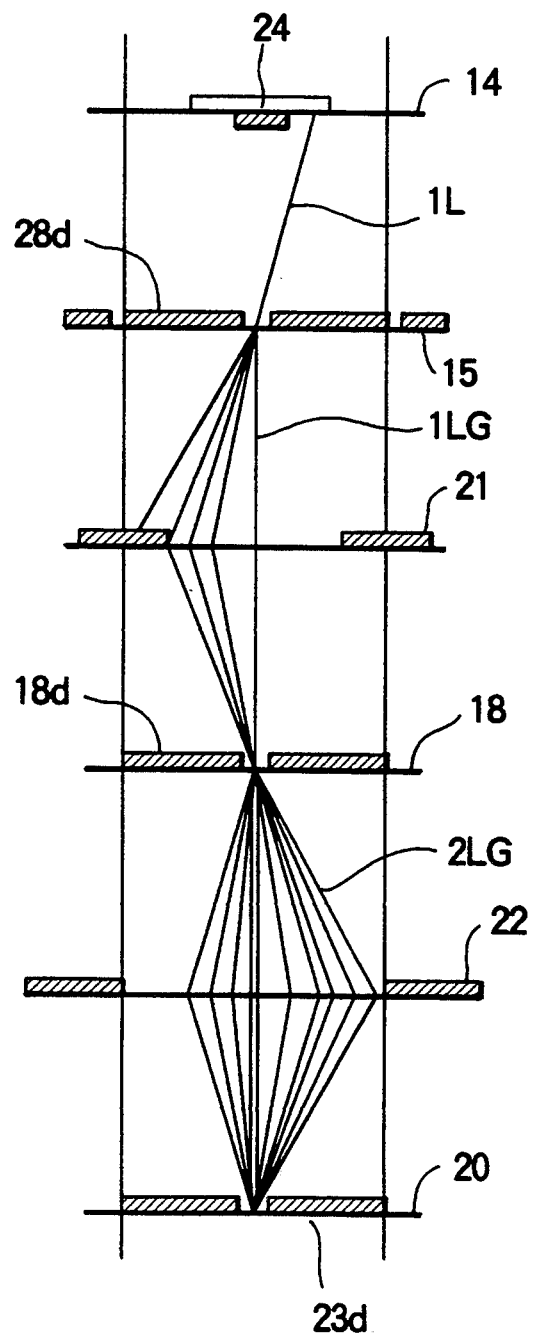
FIG. 5 is a schematic view which illustrates the principle, where a usual mask having an isolated pattern is employed, of the projection exposing apparatus shown in FIG. 1.

In the projection exposing apparatus shown in FIG. 5, the first aperture 14 forms deformed irradiation light beams. Further, the first photo-mask 18 and the second photo-mask 28 are usual masks respectively having isolated patterns 18d and 28d formed regardless of the pattern size. In the projection exposing apparatus shown in FIG. 5, light beam 1L passed from the first aperture 14, which is the second light source surface, is made incident on the pattern 28d at a certain angle of incidence, the pattern 28d being the isolated pattern on the surface of the blind 15. As a result, Gaussian-distributed diffracted light beam 1LG can be obtained. The diffracted light beam 1LG is passed through the second aperture 21 so that the pattern 18d of the first photo-mask 18 is irradiated. Since also the foregoing pattern is the isolated pattern 18d, no optical image cannot be obtained on the pupil surface of the projection optical system 22 but Gaussian distributed-diffracted light beam 2LG is obtained so that an optical image 23d is formed on the wafer 20. The resultant depth of focus and the resolution, which are determined depending upon the spread of the diffracted light beam 2LG, were excellent, resulting in a satisfactory practicability.

Figure 6:
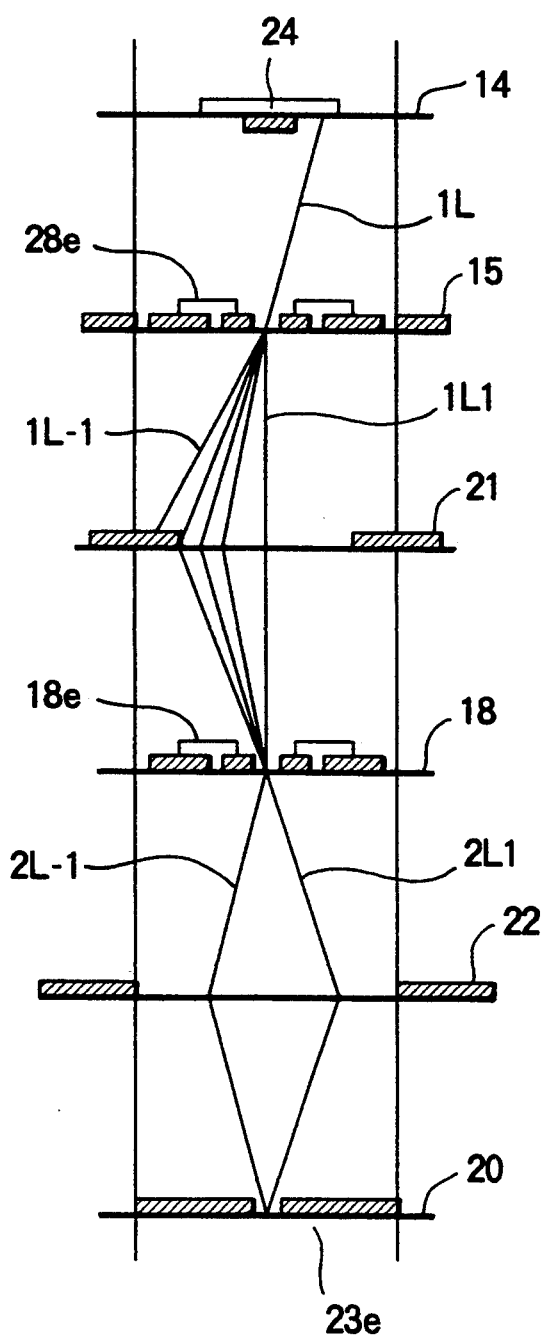
FIG. 6 is a schematic view which illustrates the principle, where a sub-shifter-type phase shift mask is employed, of the projection exposing apparatus shown in FIG. 1.

In the projection exposing apparatus shown in FIG. 6, the first aperture 14 has the light-shielding member 24 to form deformed irradiation light beams. Further, the first photo-mask 18 is a sub-shifter-type phase shift mask having an isolated pattern 18e including a precise sub-shift pattern, the size of which is smaller than the resolution limit. In the projection exposing apparatus, the fact that the sub-shift pattern is formed into a precise pattern having a size smaller than the resolution limit, prevents the formation of the resist pattern of the sub-shift pattern. However, a pseudo-periodic pattern is formed by the sub-shift pattern, so that a diffraction image like the Levenson-type shown in FIG. 2 can be obtained. Therefore, the light beams are, on the third light source surface 21, converged to substantially the central portion, causing the first photo-mask 18 to be irradiated with a high coherence. Therefore, an optical image 23e free from margin deterioration can be formed on the wafer 20 even if the deformed irradiation light source is used. Therefore, an excellent resolution and a sufficiently deep depth of focus can be realized, resulting in a satisfactory practicability.

Figure 7:
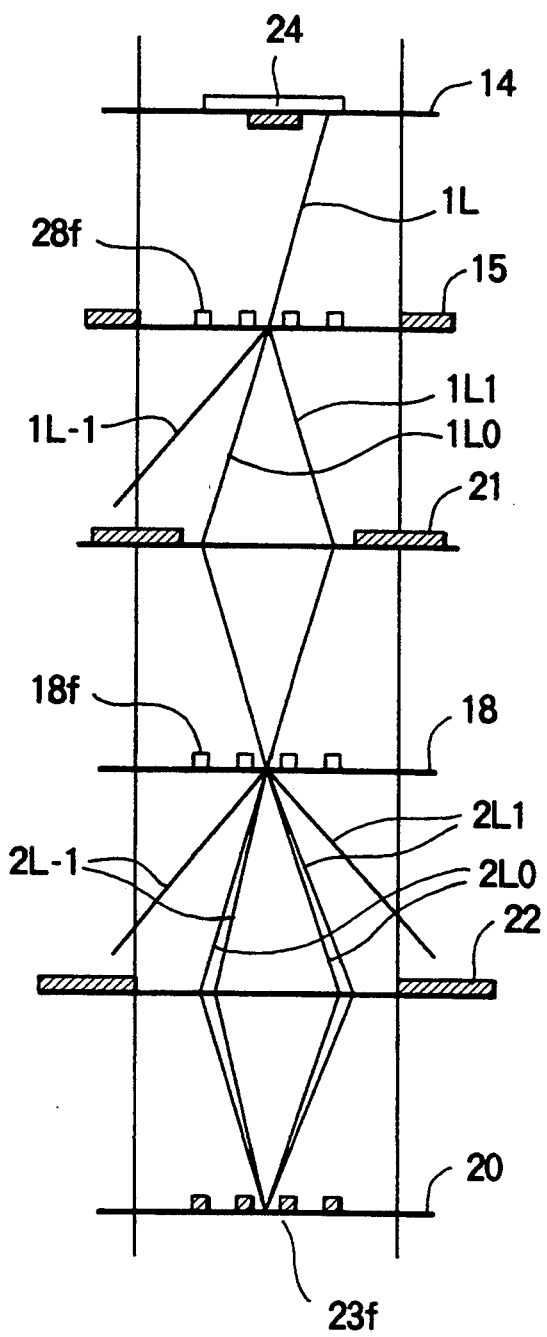
FIG. 7 is a schematic view which illustrates the principle, where a shifter light-shielding-type phase shift mask is employed, of the projection exposing apparatus shown in FIG. 1.

In the projection exposing apparatus shown in FIG. 7, the first aperture 14 forms deformed, light beams and the first photo-mask 18 and the second photo-mask 28 are light-shielding-type phase shift masks respectively having the precise patterns 18f and 28f. In the projection exposing apparatus, light beams incident on the second photo-mask 28 of the blind 15 are diffracted by the precise pattern 28f so that a light source image like a light source image obtainable in the case of the usual mask can be formed on the third light source surface 21. Since also the light source on the third light source surface 21 forms diagonally deformed light beams in the foregoing case, the pattern 18f of the first photo-mask 18 is projected on to the wafer 20 as an image 23f, the resolution and the depth of focus of which are improved.

Figure 8:
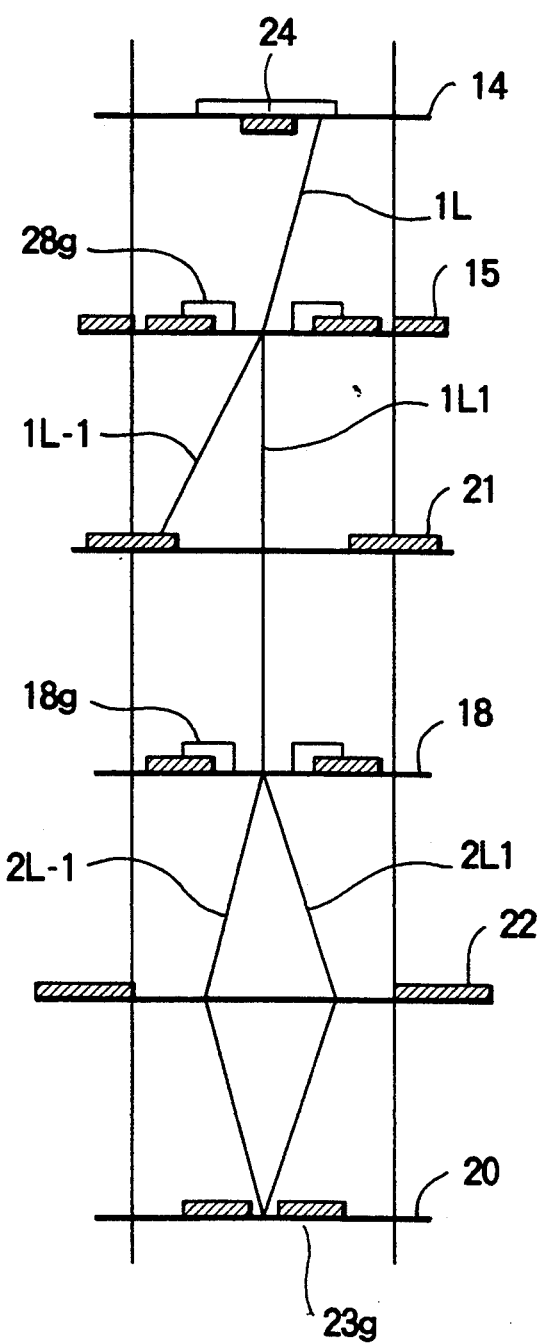
FIG. 8 is a schematic view which illustrates the principle, where a self-alignment-type phase shift mask is employed in the projection exposing apparatus shown in FIG. 1.

In the projection exposing apparatus shown in FIG. 8, the first aperture 14 forms deformed irradiation light beams. Further, the first photo-mask 18 is a self-alignment-type phase shift mask having a precise pattern 18g. Therefore, also the second photo-mask 28 on the blind 5 is a self-alignment-type phase shift mask having a precise pattern 28g similar to the first photo-mask 18. In the projection exposing apparatus shown in FIG. 8, light beams incident on the second photo-mask 28 on the blind 15 are used to irradiate the pattern 28g of the second photo-mask 28 to be diffracted so that substantially the central portion of the upper surface of the third light source surface 21 is irradiated. Therefore, the third light source surface 21 is a usual light source. Therefore, the periphery of the main peak of the optical image is cancelled by the phase shift member of the precise pattern 18g. As a result, a sharp optical image 23g can be obtained on the wafer 20.

Figure 9:
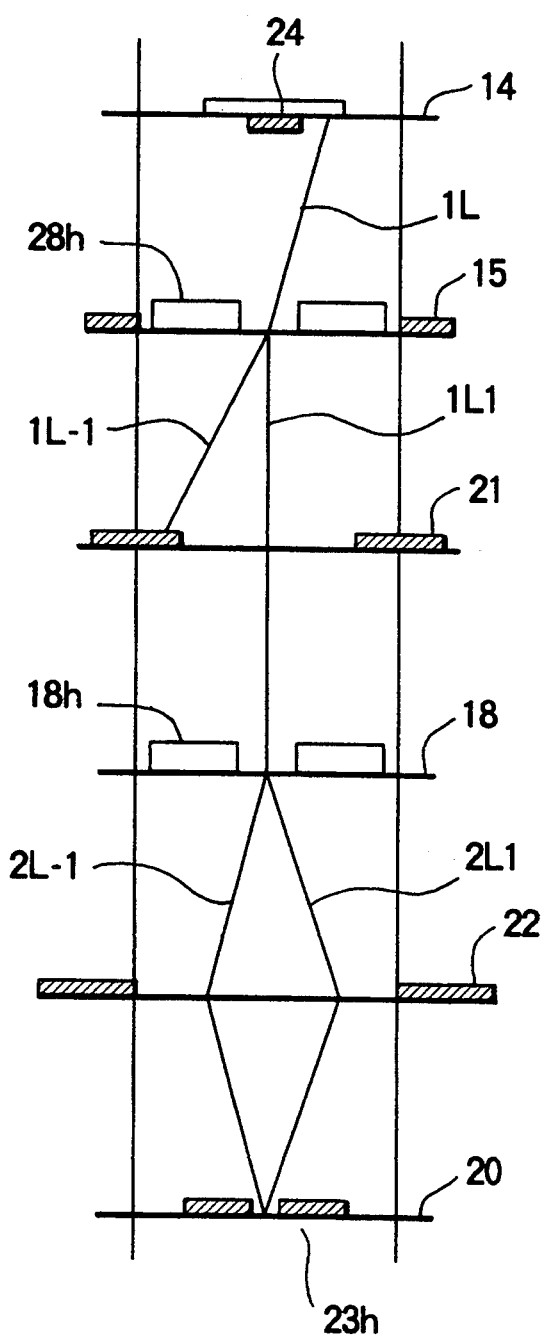
FIG. 9 is a schematic view which illustrates the principle, where a half-tone-type phase shift mask is employed, of the projection exposing apparatus shown in FIG. 1.

In the projection exposing apparatus shown in FIG. 9, the first aperture 14 performs deformed irradiation, and the first photo-mask 18 is a half-tone-type phase shift mask having a half-tone precise pattern 18h. Therefore, also the second photo-mask 28 on the blind 15 is a half-tone-type phase shift mask having a half tone precise pattern 28h similar to the first photo-mask 18. In the projection exposing apparatus shown in FIG. 9, light beams incident on the second photo-mask 28 are diffracted to irradiate substantially the central portion of the third light source surface 21. In this case, diagonal incidental 0-order diffracted light beams are decreased but 1-order diffracted light beams are increased. Therefore, the third light source surface is made to be a usual light source. As a result, the periphery of the main peak of the optical image is cancelled by the half tone precise pattern 18h, resulting in that a sharp optical image 23h can be obtained on the wafer 20.

Although each of the modifications of the first embodiment comprises the second photo-mask 28, which has the same pattern as that of the first photo-mask 18 having a circuit pattern formed thereon, disposed in the aperture of the blind 15, a second photo-mask, which is not the same as the first photo-mask 18 and which has a pattern corresponding to the circuit pattern of the first photo-mask 18, may be used. That is, a pattern, which is disposed at the same position as that of the circuit pattern of the first photo-mask 18 and which has different dimensions such as the pattern width and the pattern size, may be the second photo-mask 28. The second photo-mask 28 enables the amount of exposure in each portion on the first photo-mask 18 to be adjusted.

In the case where the photo-mask has a precise isolated pattern such as a contact hole, the optimum amount of exposure to which the isolated pattern is subjected is determined depending upon the size of the pattern. Therefore, the conventional technology encounters an impossibility in that a plurality of isolated patterns having different dimensions cannot be formed on one photo-mask for the purpose of performing optimum exposure, and therefore, only isolated patterns having the same dimensions can be formed. However, the foregoing first embodiment is arranged so that the dimensions of the isolated patterns formed on the second photo-mask 28, that is, the aperture area, can be adjusted. Therefore, the amount of exposure for each pattern can be adjusted.

Figure 10:
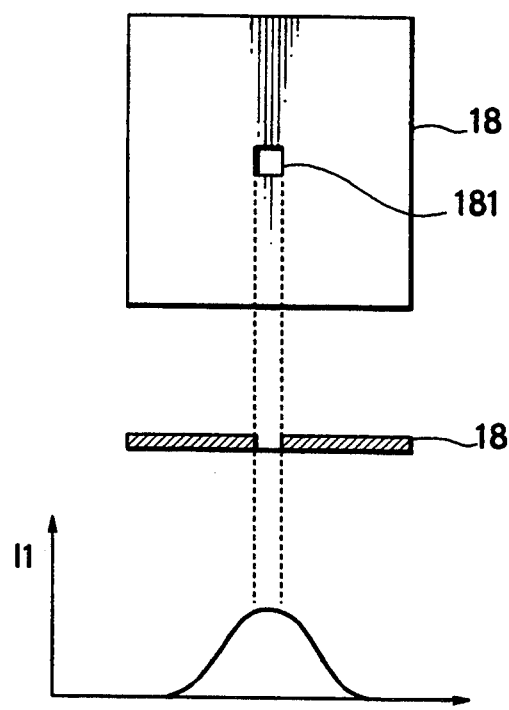
FIG. 10 illustrates distribution of intensities transmissive light beams obtained in a case where a first photo-mask having a precise and isolated pattern is used.
Figure 11:
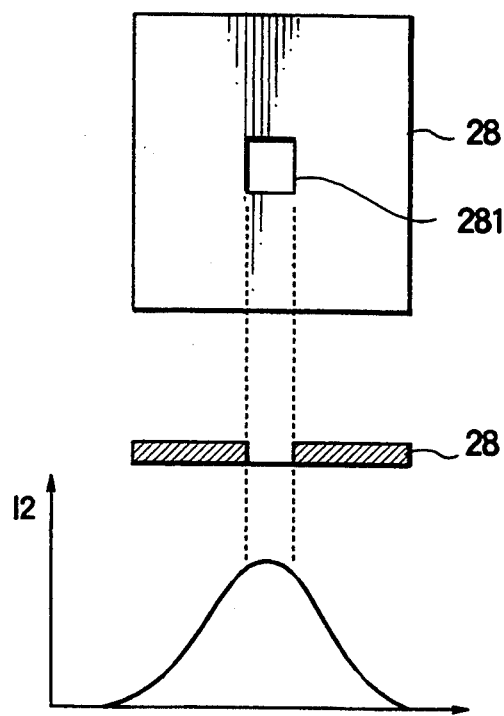
FIG. 11 illustrates distribution of intensities of transmissive light beams obtained in a case where a second photo-mask corresponding to the first photo-mask shown in FIG. 10 is used.

In an example case shown in FIG. 10 where the first photo-mask 18 has a precise and isolated pattern 181 having a size about 0.4 to 0.5 μm, an isolated pattern 281 having an aperture area which is about two times that of the pattern 181 is formed on the second photo-mask 28 as shown in FIG. 11. When exposure is performed by making use of irradiation light having a wavelength of 365 nm, the resultant distribution of intensities I2 of light beams, which are passed through the isolated pattern 281, has the same shape as that of the distribution of intensities I1 which are passed through the isolated pattern 181 of the first photo-mask 18, the light intensity I2 having a size which is n times that of the light intensity I1. Therefore, even if the first photo-mask 18 has isolated patterns and/or coarse patterns having different sizes in addition to the isolated pattern 181, the optimum amount of exposure can be determined for each of the patterns.

Figure 12:
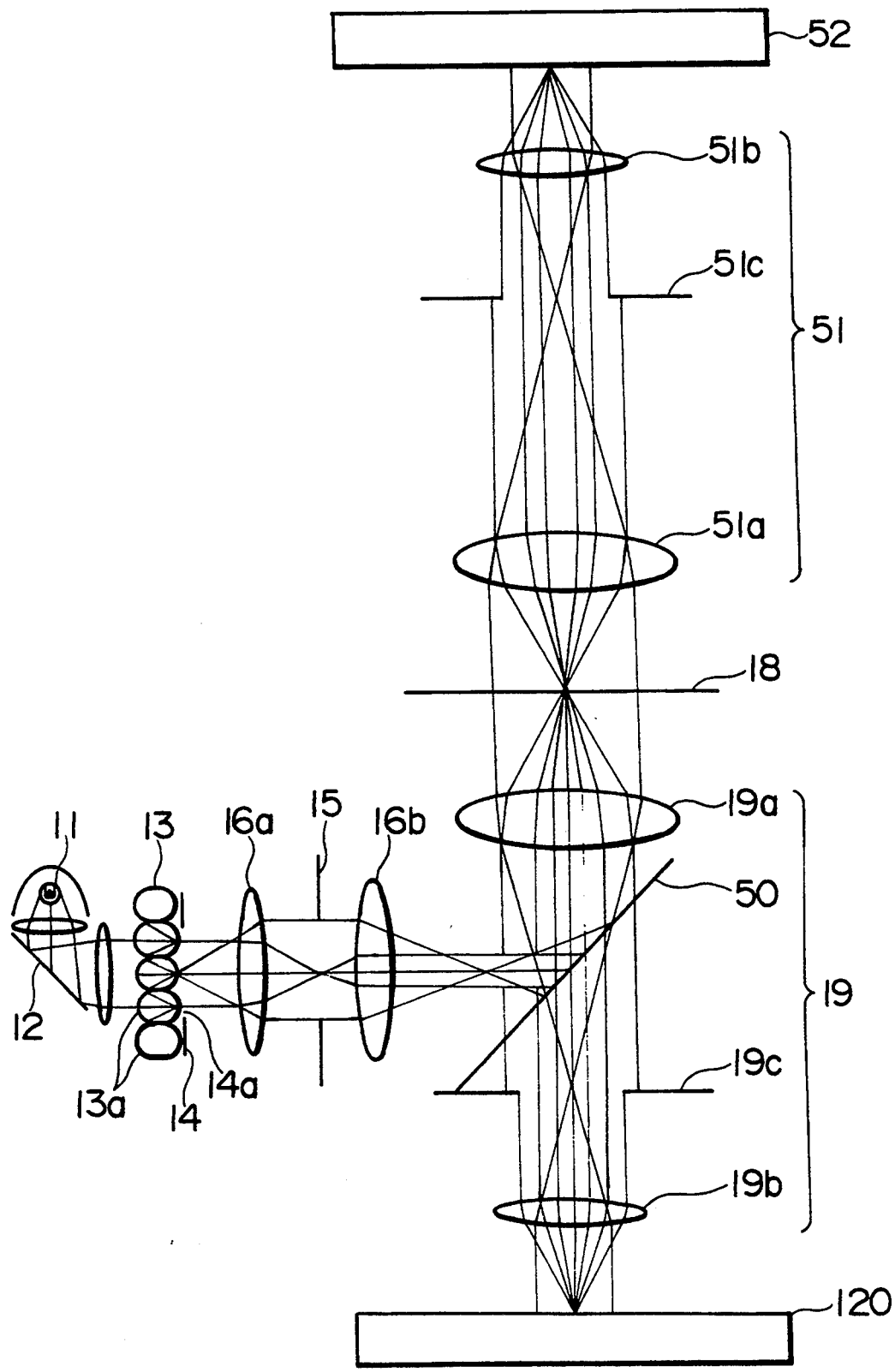
FIG. 12 illustrates the optical system of a exposing apparatus according to a second embodiment of the present invention.

FIG. 12 illustrates an optical system of a projection exposing apparatus according to a second embodiment of the present invention. A fly-eye lens 13 and a mirror 12 are disposed in front of a light source 11 which is a lamp house. A first aperture member 14 is disposed in front of the fly-eye lens 13, the first aperture member 14 having a circular aperture 14a in the central portion therefore to shape, on the second light source surface, irradiation light beams passed through the fly-eye lens 13. A blind 15 for determining the exposing range, converging lenses 16a, 16b and a half mirror 17 are disposed in front of the first aperture member 14. An exposing photo-mask 18 having a desired circuit pattern is disposed above a half mirror 50 with a first projection lens 19a between the photo-mask 18 and the half mirror 50. Further, a mirror 52 is disposed in front of the photo-mask 18 with second projection lenses 51a, 51b and a second projection lens pupil 51c between the photo-mask 18 and the mirror 52. On the other hand, a second projection lens pupil 19c and a second projection lens 19b are disposed below the half mirror 50. In addition, a wafer 20, which is a substrate to be exposed light, is disposed below the second projection lens 19b.

In the projection exposing apparatus according to the second embodiment, the aperture member 14 has the light shielding member 24 (see FIG. 13) at the central portion of the aperture 14a similar to the first embodiment.

Light beams supplied from the light source 11 reach the fly-eye lens 13 by way of the mirror 12, the light beams being then distributed to respective lenses 13a that constitute the fly-eye lens 13. The light beams which have been passed through the respective lenses 13a are deformed by the light shielding member 24 (see FIG. 13) disposed in the aperture 14a of the aperture member 14. The deformed light beams are passed through the converging lens 16a, the blind 15, the converging lens 16b, the half mirror 50 and the first projection lens 19a so that the overall exposure region of the photo-mask 18 is irradiated with the light beams. Therefore light beams, which have been passed through the respective lenses 13a of the fly-eye lens 13 are superimposed on one another on the surface of the photo-mask 18, and therefore, uniform irradiation is achieved. The light beams which have been upwardly passed through the mask 18 as described above are passed through the second projection optical system 51 including the lens 51a, the pupil 51c and the lens 51b to reach the mirror 52. The light beams are reflected by the mirror 52 to be passed through the lens 51b, the pupil 51c and the lens 51a to again reach the photo-mask 18. The light beams passed through downwards the photo-mask 18 are passed through the first projection optical system 19 including the lens 19a, the pupil 19c and the lens 19b to reach the wafer 20. As a result, the fine circuit pattern is printed on a resist film (omitted from illustration) applied to the surface of the wafer 20.

FIGS. 13 to 36 respectively are views which respectively further schematically illustrate the projection exposing apparatus according to the second embodiment shown in FIG. 12 and its modifications. The corresponding elements are given the same or corresponding reference numerals. The projection exposing apparatus shown in FIGS. 13 to 36 comprise the following elements that are arranged individually: a photo-mask 18 having a circuit pattern for forming an optical image on a wafer 20. However, the projection exposing apparatus commonly comprise the following elements: an aperture 14 to be irradiated by the light source 11 (see FIG. 12) as a second light source surface of deformed irradiation, a blind 15 for determinant the region to be exposed to the irradiation light beams, and first and second projection optical systems 19 and 51.

Figure 13:
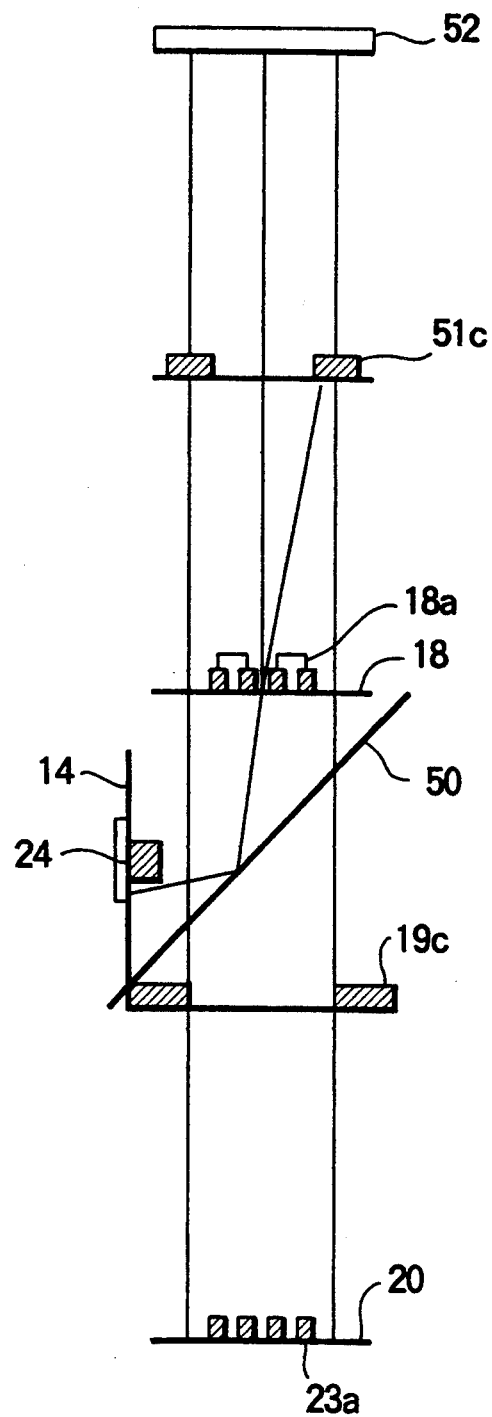
FIG. 13 illustrates a state where light beams supplied from an aperture reach a mirror in a case where the Levenson-type phase shift mask is employed in the projection exposing apparatus shown in FIG. 12.
Figure 14:
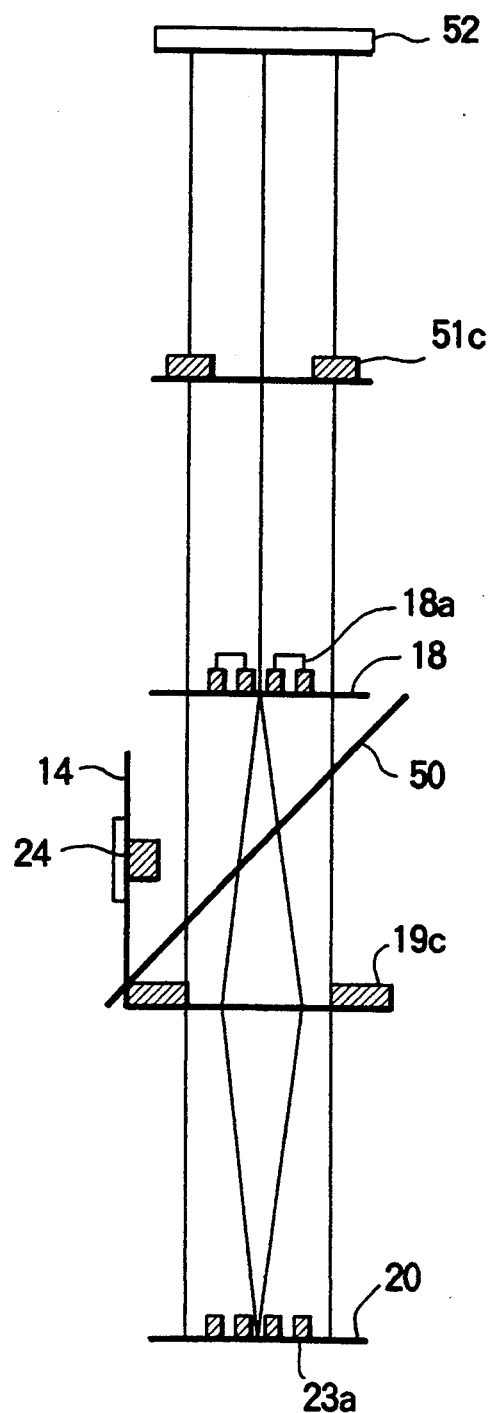
FIG. 14 illustrates a state where light beams reflected from the mirror reach a wafer in a case where the Levenson-type phase shift mask is employed in the projection exposing apparatus shown in FIG. 12.
Figure 15A:
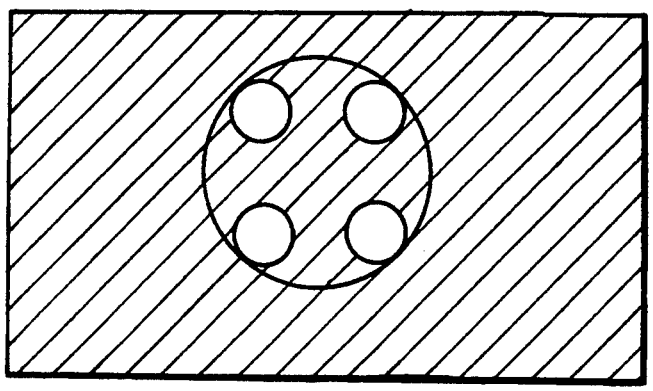
FIGS. 15a to 15c respectively illustrate light source images at the aperture, at a second projection lens pupil and at a first projection lens pupil in a case where the Levenson-type phase shift mask is employed in the projection exposing apparatus shown in FIG. 12.
Figure 15B:
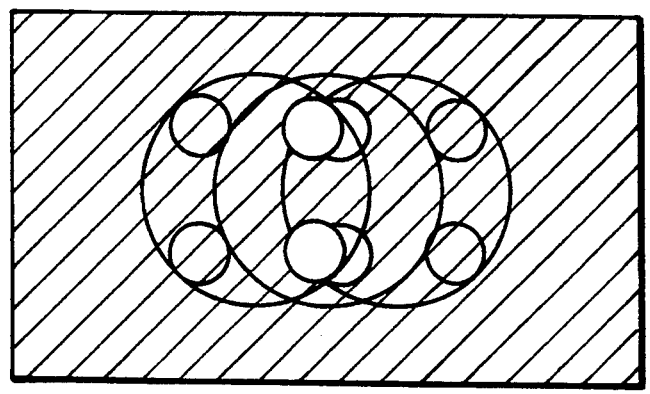
Figure 15C:
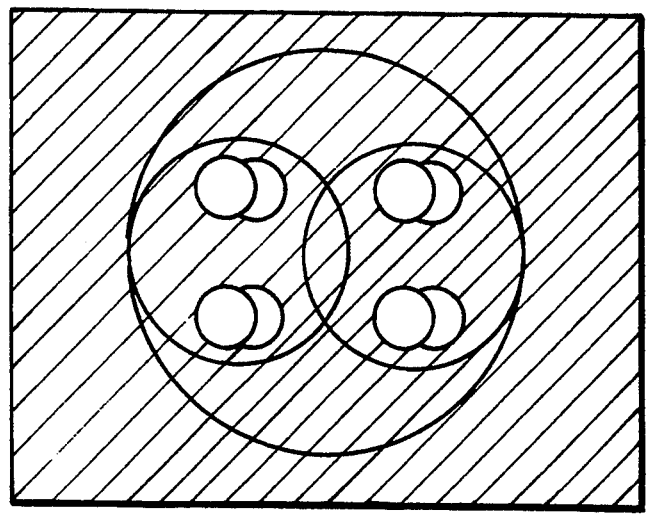

In the projection exposing apparatus shown in FIGS. 13 and 14, the photo-mask 18 has a Levenson-type phase shift pattern 18a. FIG. 13 illustrates a state where the irradiation light beams passed through the aperture reach the mirror 52. FIG. 14 illustrates a state where light beams reflected by the mirror 52 reach the wafer 20. In the projection exposing apparatus shown in FIGS. 13 and 14, irradiation light beams passed from the aperture 14, which forms a second light source image, are upwardly reflected by the half mirror 50 so that the photo-mask 18 is irradiated. The irradiation light beams are diffracted by the Levenson-type phase shift pattern 18a of the photo-mask 18 through the pupil 51c of the second projection optical system 51. At this time, ±1-order diffracted light beams are formed on the pupil 51c as shown in FIG. 15b. Since the outer components of the ±1-order diffracted light beams are cut by the pupil 51c, a bisected irradiation is realized. The irradiation light beams passed through the pupil 51c are reflected by the mirror 52, and passed through the pupil 51c to again irradiate the photo-mask 18. Although the phase shift pattern 18a of the photo-mask 18 again forms ±1-order diffracted light beams, the bisected irradiation light beams form a light source image shown in FIG. 15c on the pupil 19c of the first projection optical system 19. The light beams passed through the pupil 19c form an optical image 23a on the wafer 20. Since the Levenson-type phase shift pattern causes the depth of focus to be enlarged at the time of bisected irradiation, the foregoing modification is able secure a satisfactorily deep depth of focus.

Figure 16:
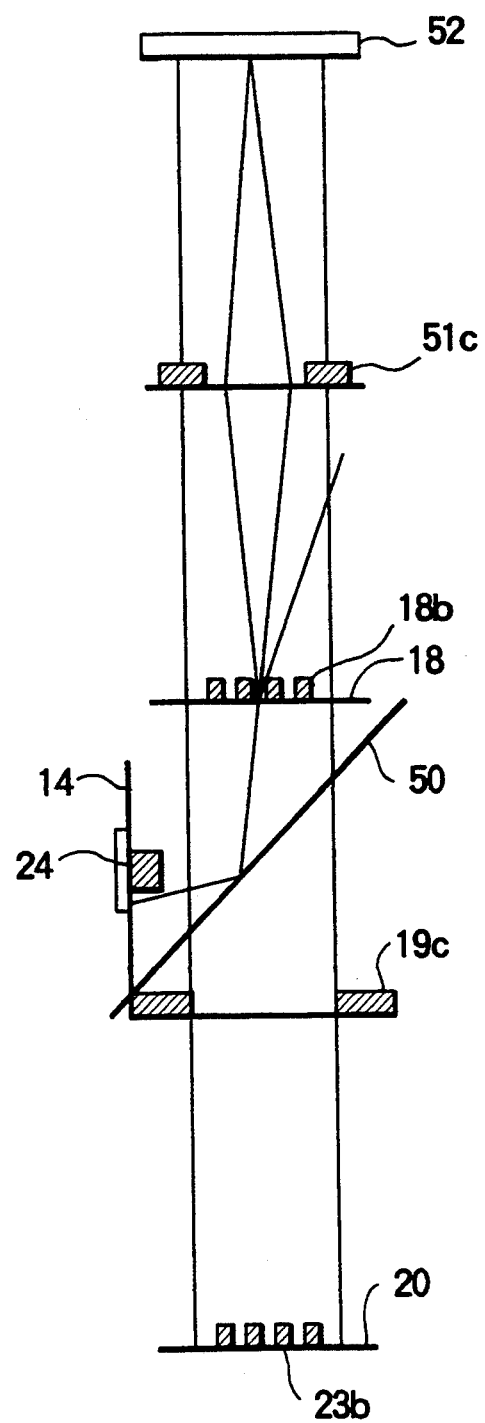
FIG. 16 illustrates a state where the irradiation light beams passed from the aperture reach the mirror in a case where the usual mask having a precise pattern is employed in the projection exposing apparatus shown in FIG. 12.
Figure 17:
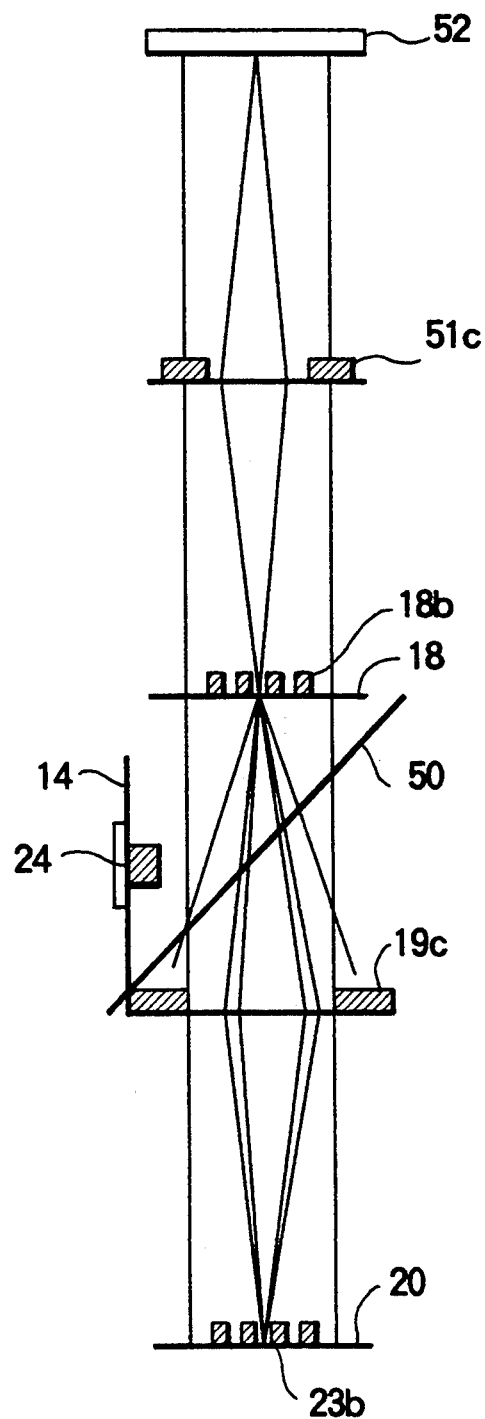
FIG. 17 illustrates a state where light beams reflected from the mirror reach the wafer in a case where the usual mask having a precise pattern is employed in the projection exposing apparatus shown in FIG. 12.
Figure 18A:
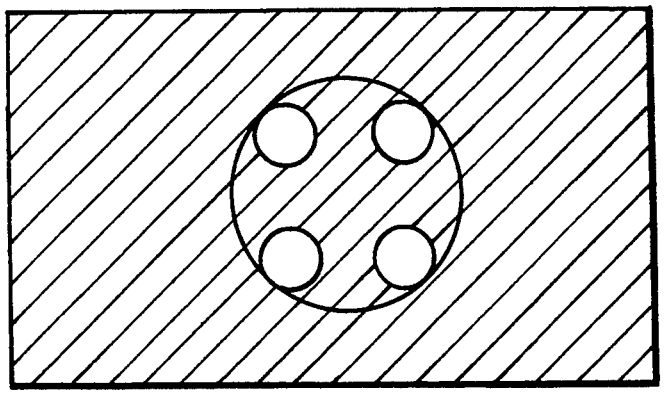
FIGS. 18a to 18c respectively illustrate light source images at the aperture, at the second projection lens pupil and at the first projection lens pupil in a case where the usual mask having a precise pattern is employed in the projection exposing apparatus shown in FIG. 12.
Figure 18B:
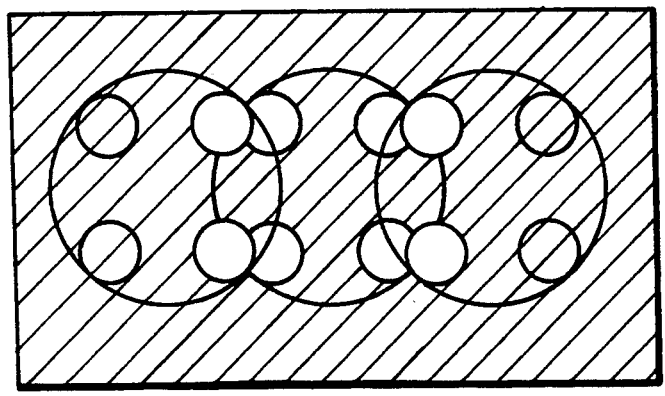
Figure 18C:
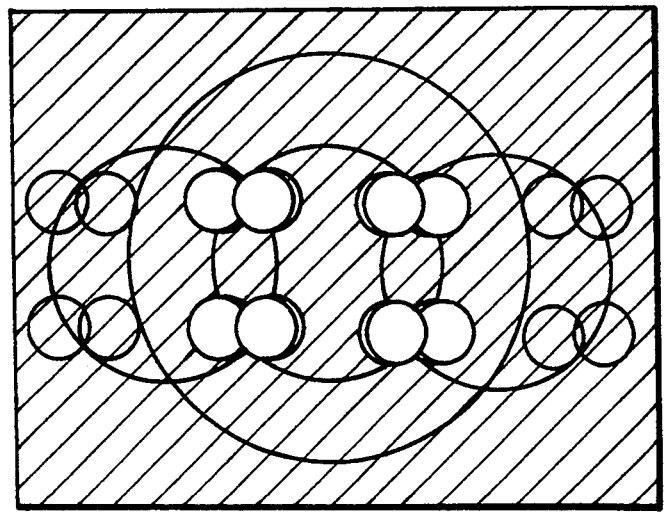

In the projection exposing apparatus shown in FIGS. 16 and 17, the photo-mask 18 is a usual mask having a precise pattern 18b. In the foregoing projection exposing apparatus, irradiation light beams passed from the aperture 14, which forms the second light source image as shown in FIG. 18a, are reflected upwardly by the half mirror 50 so that the photo-mask 18 is irradiated. The irradiation light beams are diffracted by the precise pattern 18b of the photo-mask 18 so that the pupil 51c of the second projection optical system 51 is irradiated. The light source image is formed into a shape as shown in FIG. 18b so that the deformed irradiation is maintained. The irradiation light beams passed through the pupil 51c are reflected by the mirror 52, and then passed through the pupil 51c so that the photo-mask 18 is again irradiated. Since the irradiation light beams are deformed irradiation at this time, the diffracted light beams formed by the precise pattern 18b form a light source image shown in FIG. 18c on the pupil 19c of the first projection optical system 19. The irradiation light beams passed through the pupil 19c form an optical image 23b on the wafer 20. In the case of a precise pattern, the depth of focus is enlarged with the deformed irradiation as compared with the usual irradiation. Therefore, the foregoing modification enables satisfactorily deep depth of focus to be obtained.

Figure 19:
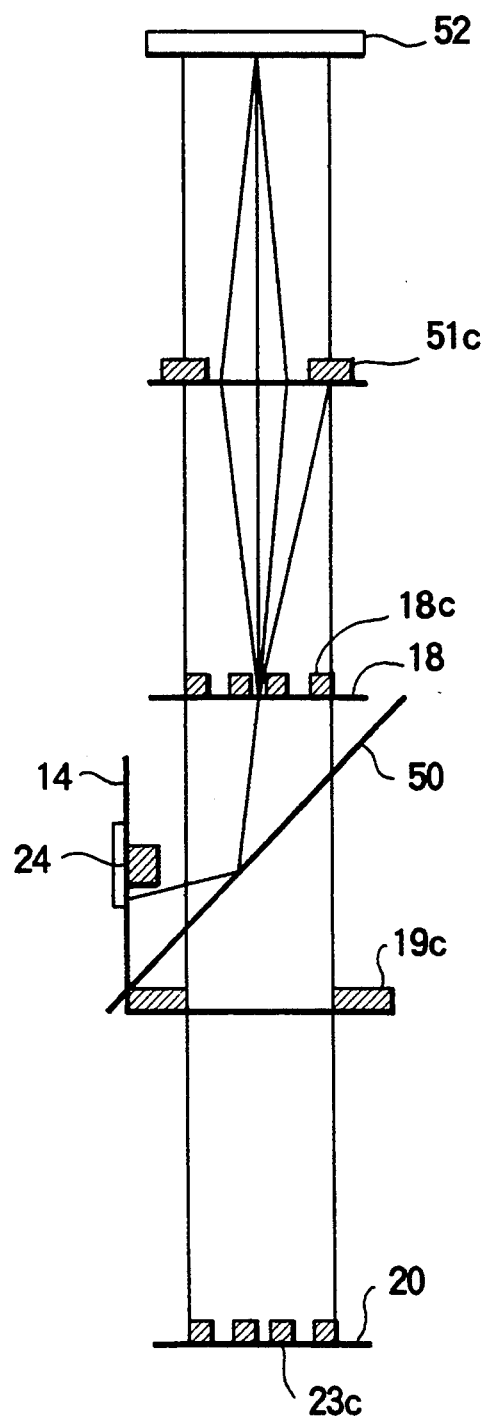
FIG. 19 illustrates a state where the irradiation beams passed from the aperture reach the mirror in a case where the usual mask having a coarse pattern is employed in the projection exposing apparatus shown in FIG. 12.
Figure 20:
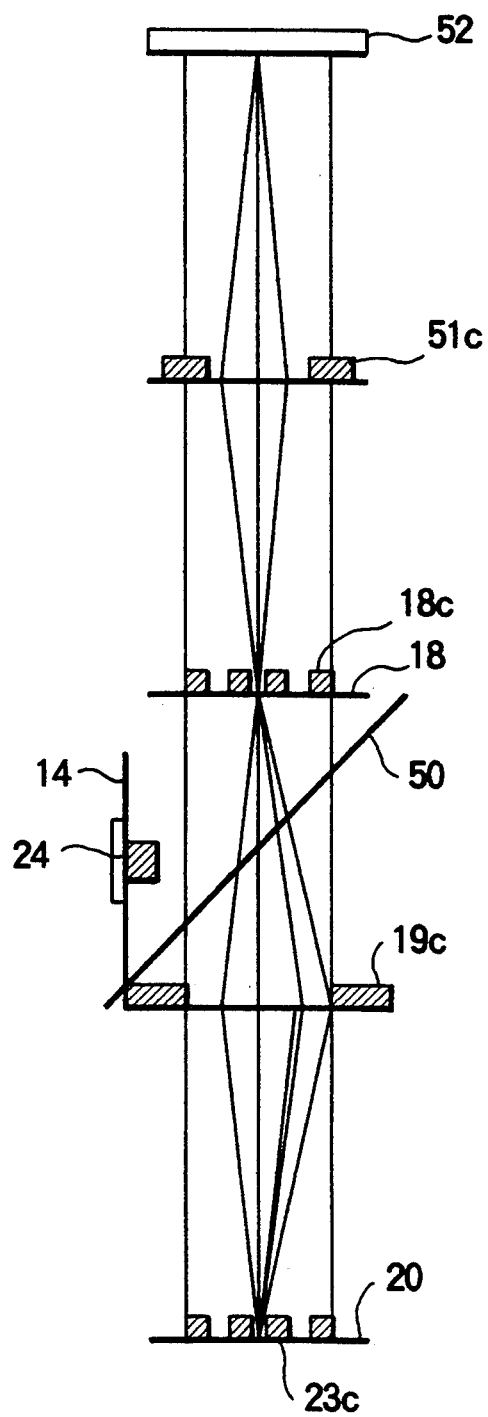
FIG. 20 illustrates a state where light beams reflected from the mirror reach the wafer in a case where the usual mask having the coarse pattern is employed in the projection exposing apparatus shown in FIG. 12.
Figure 21A:
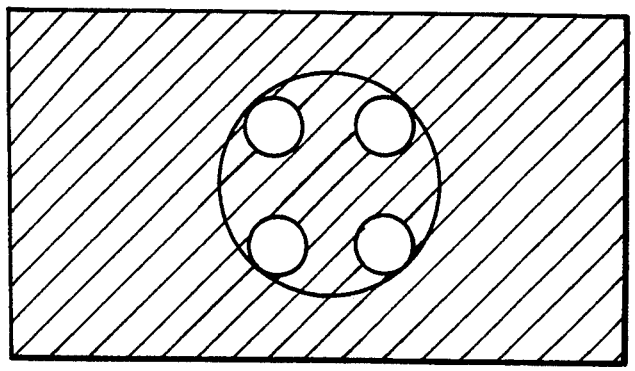
FIGS. 21a to 21c respectively illustrate light source images at the aperture, at a second projection lens pupil and at a first projection lens pupil in a case where the usual mask having a coarse pattern is employed in the projection exposing apparatus shown in FIG. 12.
Figure 21B:
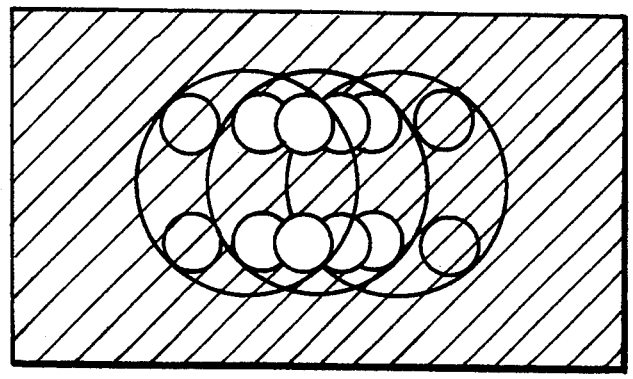
Figure 21C:
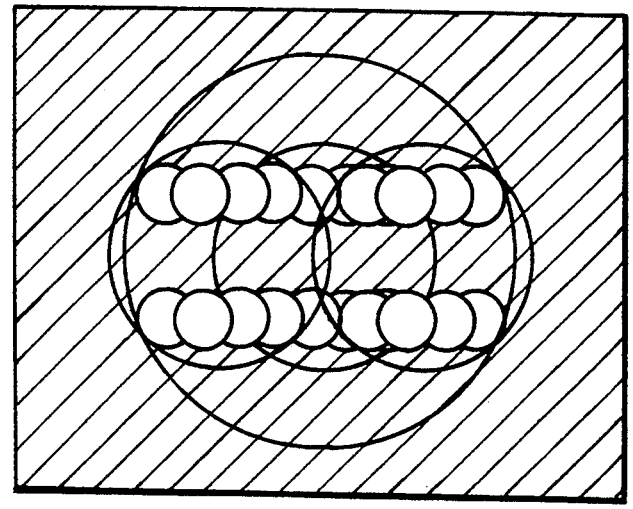

In the projection exposing apparatus shown in FIGS. 19 and 20, the photo-mask 18 is a usual mask having a relatively large pattern 18c. In the foregoing projection exposing apparatus, the irradiation light beams passed from the aperture 14, which forms a second light source image as shown in FIG. 21a, are upwardly reflected by the half mirror 50 so that the photo-mask 18 is irradiated. The irradiation light beams are diffracted by the pattern 18c of the photo-mask 18 so that the pupil 51c of the second projection optical system 51 is irradiated with 0-order and 1-order diffracted light beams. The light source image is, at this time, formed into a shape as shown in FIG. 21b so that usual irradiation is formed in place of the deformed irradiation. The irradiation light beams passed through the pupil 51c are reflected by the mirror 52, and then passed through the pupil 51c so that the photo-mask 18 again irradiated. Since the irradiation light beams are usual irradiation light beams at this time, the diffracted light beams formed by the relatively large pattern form a light source image as shown in FIG. 21c on the pupil 19c of the first projection optical system 19. The light beams passed through the pupil 19c form an optical image 23c on the wafer 20. In the case of a relatively large pattern, the depth of focus is enlarged if the usual irradiation is used as compared with the deformed irradiation. Therefore, the foregoing modification enables satisfactorily deep depth of focus to be obtained.

Figure 22:
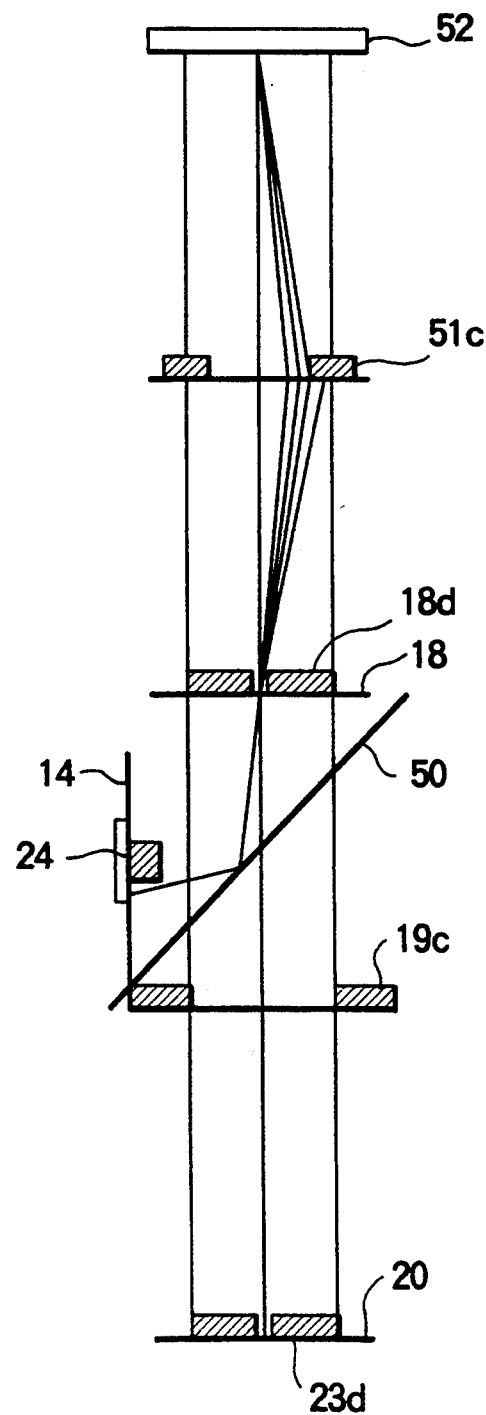
FIG. 22 illustrates a state where irradiation light beams passed from the aperture reach the mirror in a case where a usual mask having an isolated pattern is employed in the projection exposing apparatus shown in FIG. 12.
Figure 23:
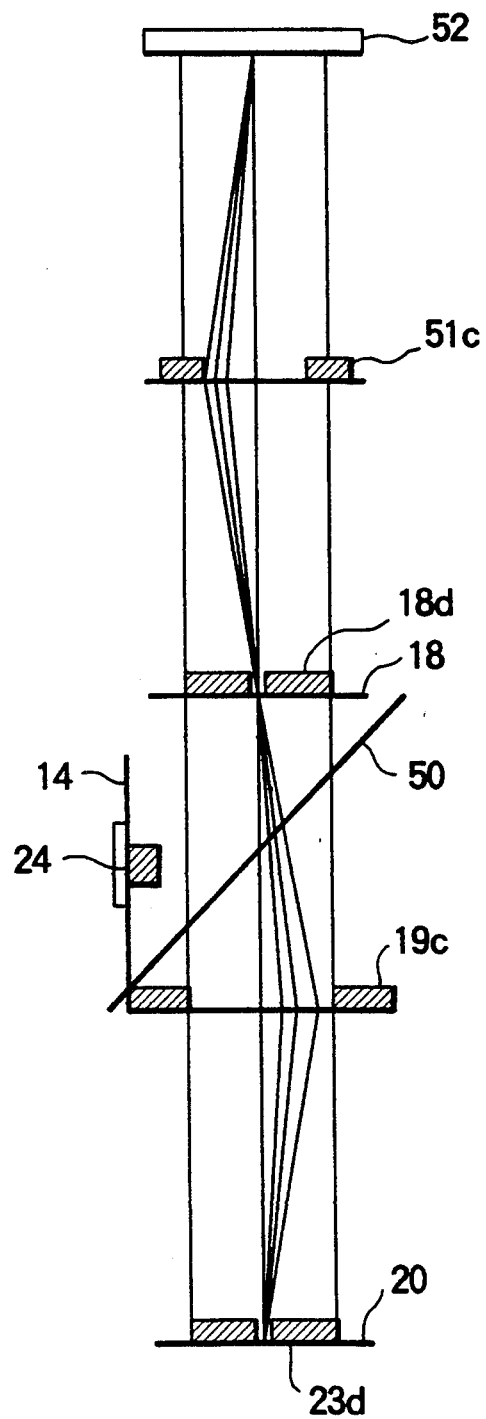
FIG. 23 illustrates a state where light beams reflected from the mirror reach the wafer in a case where the usual mask having an isolated pattern is employed in the projection exposing apparatus shown in FIG. 12.
Figure 24A:
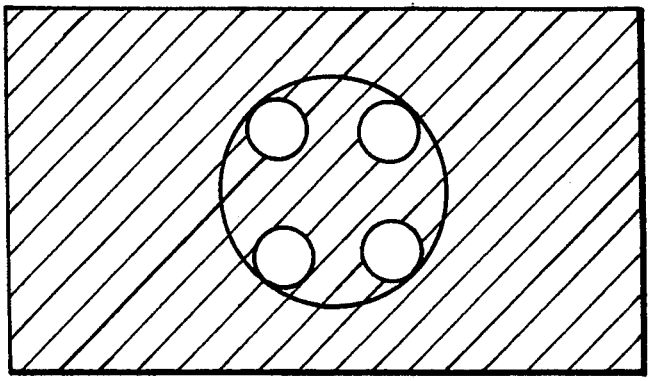
FIGS. 24a to 24c respectively illustrate light source images at the aperture, at the second projection lens pupil and at the first projection lens pupil in a case where the usual mask having an isolated pattern is employed in the projection exposing apparatus shown in FIG. 12.
Figure 24B:
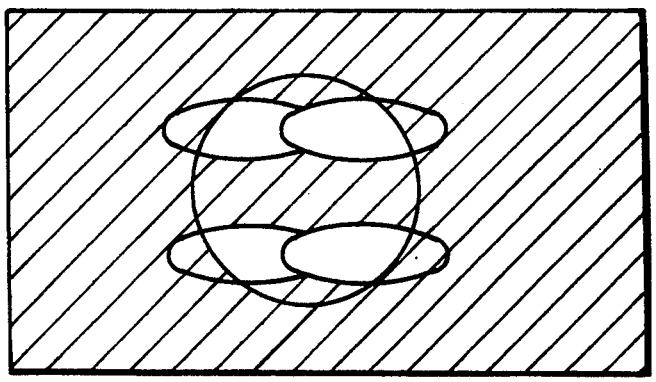
Figure 24C:
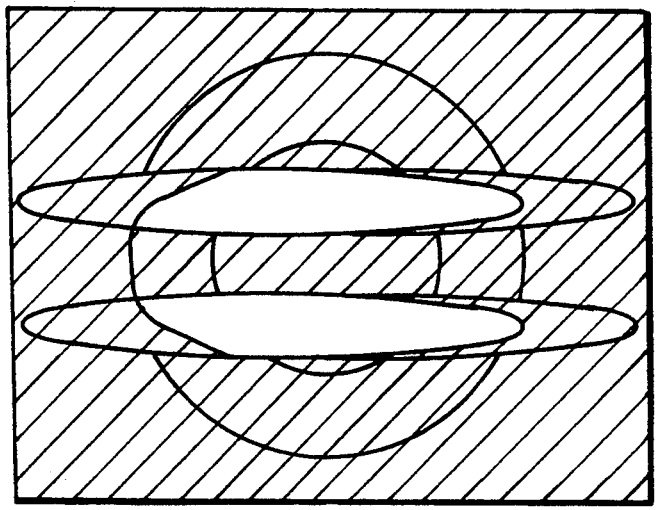

In the projection exposing apparatus shown in FIGS. 22 and 23, the photo-mask 18 is a usual mask having an isolated pattern 18d. In the foregoing projection exposing apparatus, the irradiation light beams passed from the aperture 14, which forms a second light source image as shown in FIG. 24a, are reflected upwardly by the half mirror 50 so that the photo-mask 18 is irradiated. The irradiation light beams are diffracted by the isolated pattern 18d of the photo-mask 18 so that the pupil 51c of the second projection optical system 51 is irradiated. The light source image is formed into a shape as shown in FIG. 24b at this time so that usual irradiation is performed in place of the deformed irradiation. The irradiation light beams passed through the pupil 51c are reflected by the mirror 52, and passed through the pupil 51c so that the photo-mask 18 is again irradiated. Since the irradiation light beams are usual irradiation light beams at this time, the diffracted light beams formed by the isolated pattern 18d form a light source image as shown in FIG. 24c on the pupil 19c of the first projection optical system 19. The light beams passed through the pupil 19c form an optical image 23d on the wafer 20. In the case of the isolated pattern, the depth of focus is enlarged if the usual irradiation is used as compared with the deformed irradiation. Therefore, the foregoing modification enables satisfactorily deep depth of focus to be obtained.

Figure 25:
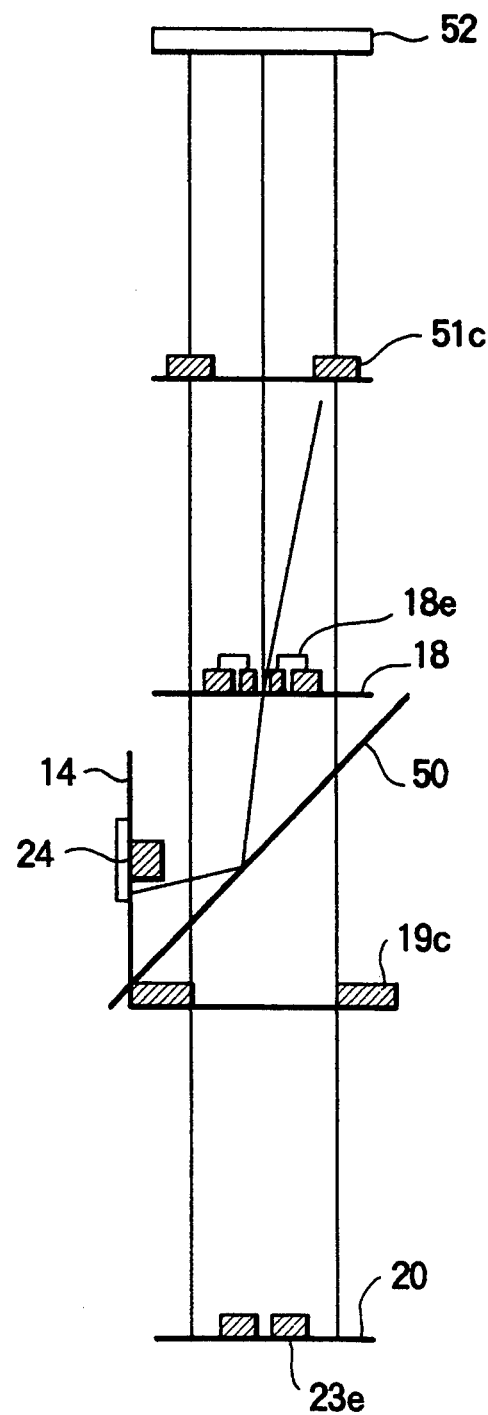
FIG. 25 illustrates a state where irradiation light beams passed from the aperture reach the mirror in a case where a sub-shifter-type phase shift mask is employed in the projection exposing apparatus shown in FIG. 12.
Figure 26:
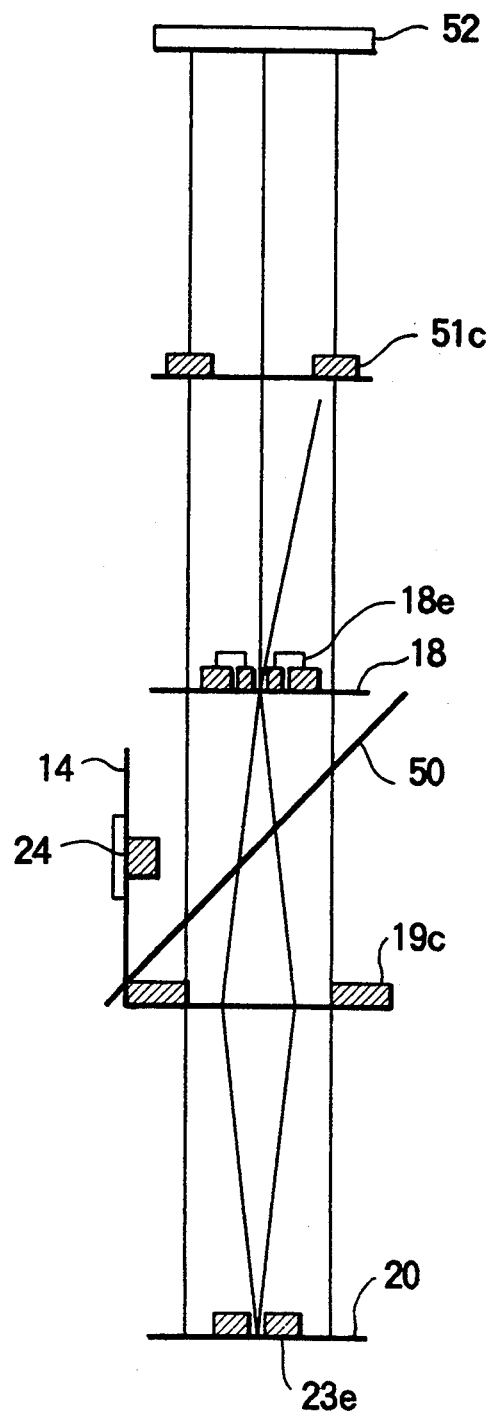
FIG. 26 illustrates a state where light beams reflected from the mirror reach the wafer in a case where the sub-shifter-type phase shift mask is employed in the projection exposing apparatus shown in FIG. 12.
Figure 27A:
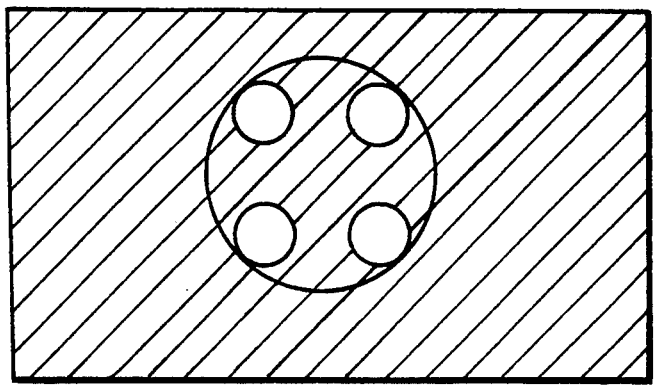
FIGS. 27a to 27c respectively illustrate light source images at the aperture, at the second projection lens pupil and at the first projection lens pupil in a case where the sub-shifter-type phase shift mask is employed in the projection exposing apparatus shown in FIG. 12.
Figure 27B:
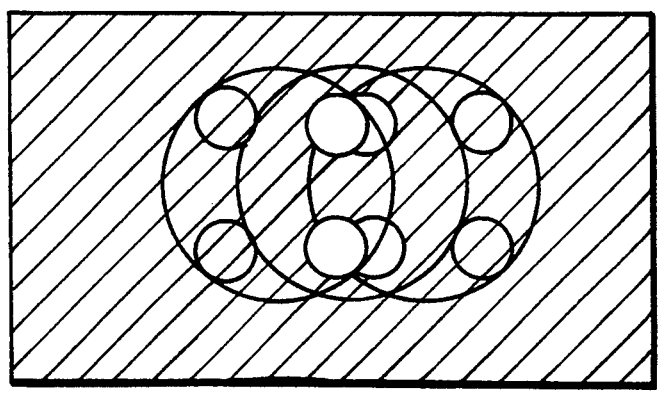
Figure 27C:
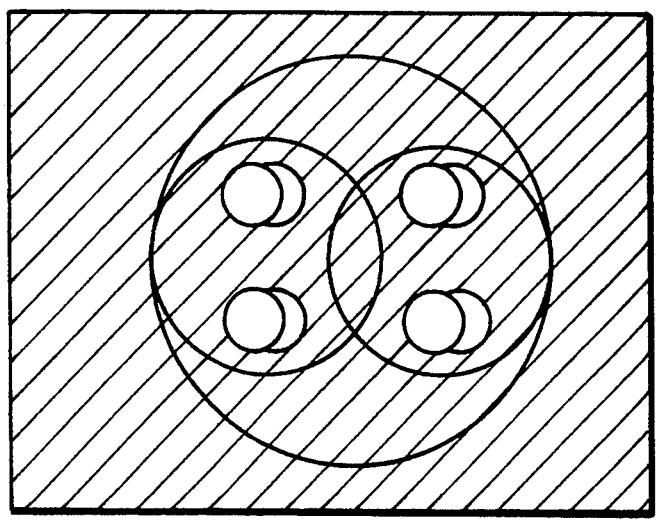

In the projection exposing apparatus shown in FIGS. 25 and 26, the photo-mask 18 has a sub-shifter-type phase shift pattern 18e. In the foregoing projection exposing apparatus, the irradiation light beams passed from the aperture 14, which forms the second light source image as shown in FIG. 27a, are reflected upwardly by the half mirror 50 so that the photo-mask is irradiated. The irradiation light beams are diffracted by the sub-shifter-type phase shift pattern 18 of the photo-mask 18 so that the pupil 51c of the second projection optical system 51 is irradiated. The light source image is formed into a shape as shown in FIG. 27b at this time so that bisected irradiation is performed. The irradiation light beams passed through the pupil 51c are reflected by the mirror 52, and then passed through the pupil 51c so that the photo-mask 18 is again irradiated. Since the irradiation light beams are bisected irradiation light beams at this time, the diffracted light beams formed by the sub-shifter-type phase shift pattern 18e form a light source image as shown in FIG. 27c on the pupil 19c of the first projection optical system 19. The light beams passed through the pupil 19c form an optical image 23e on the wafer 20. In the case of the sub-shifter-type phase shift pattern, the depth of focus is enlarged if the bisected irradiation is used, the foregoing modification enables satisfactorily deep depth of focus to be obtained.

Figure 28:
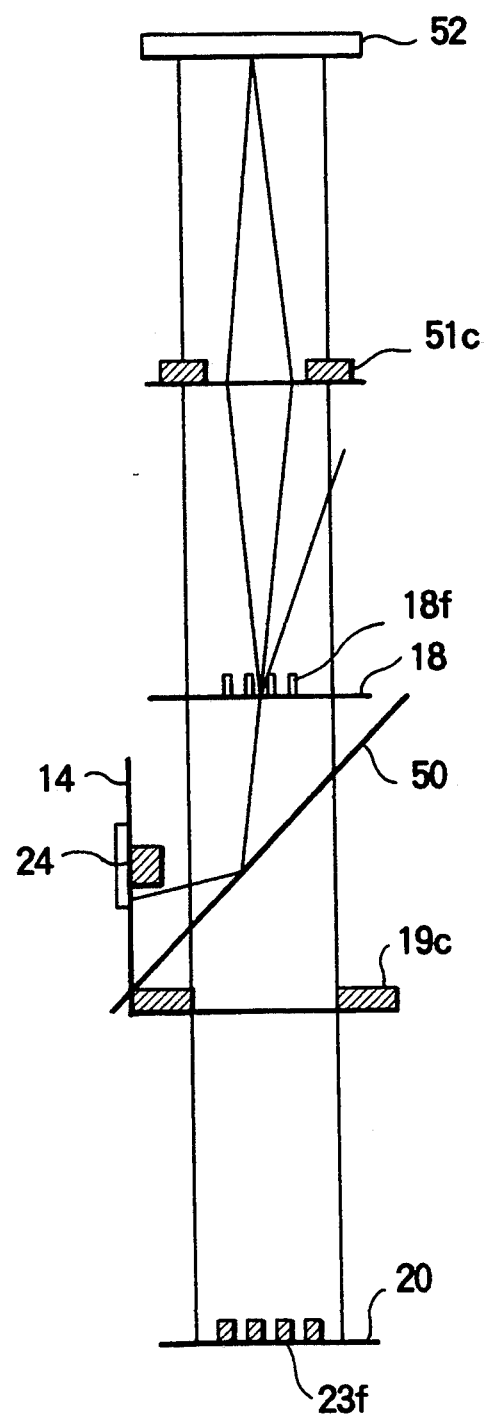
FIG. 28 illustrates a state where irradiation light beams passed from the aperture reach the mirror in a case where a shifter light-shielding phase shift mask is employed in the projection exposing apparatus shown in FIG. 12.
Figure 29:
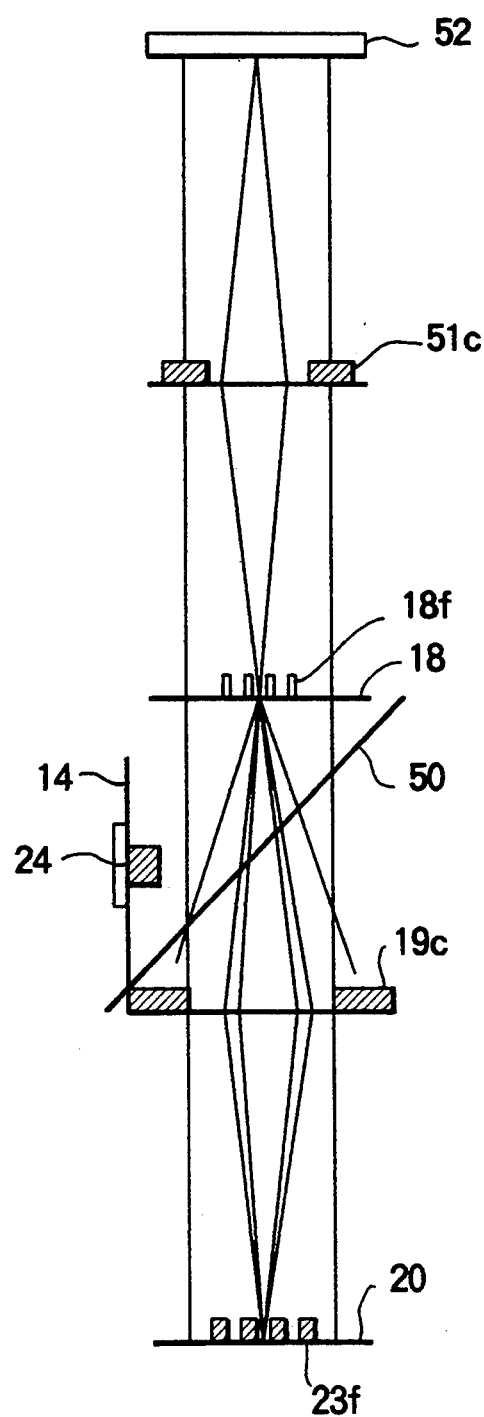
FIG. 29 illustrates a state where light beams reflected from the mirror reach the wafer in a case where the shifter light-shielding phase shift mask is employed in the projection exposing apparatus shown in FIG. 12.
Figure 30A:
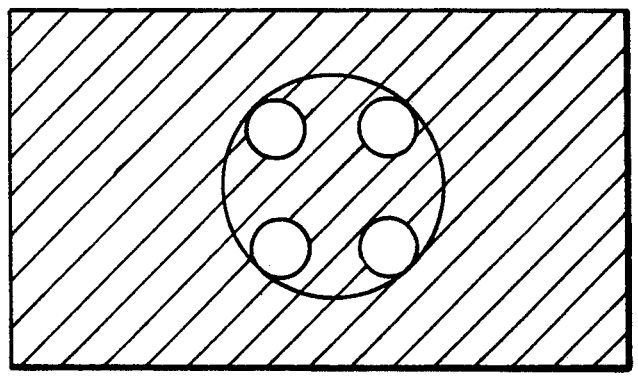
FIGS. 30a to 30c respectively illustrate light source images at the aperture, at the second projection lens pupil and at the first projection lens pupil in a case where the shifter light-shielding phase shift mask is employed in the projection exposing apparatus shown in FIG. 12.
Figure 30B:
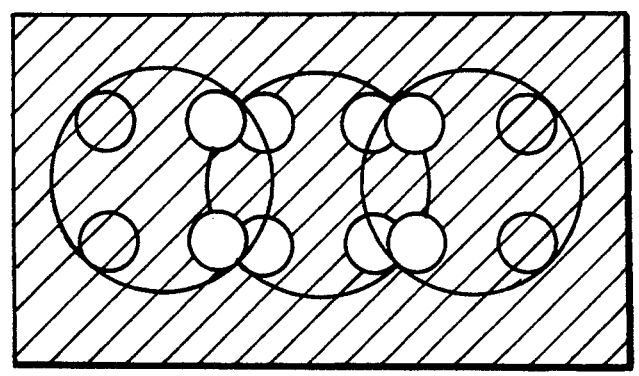
Figure 30C:
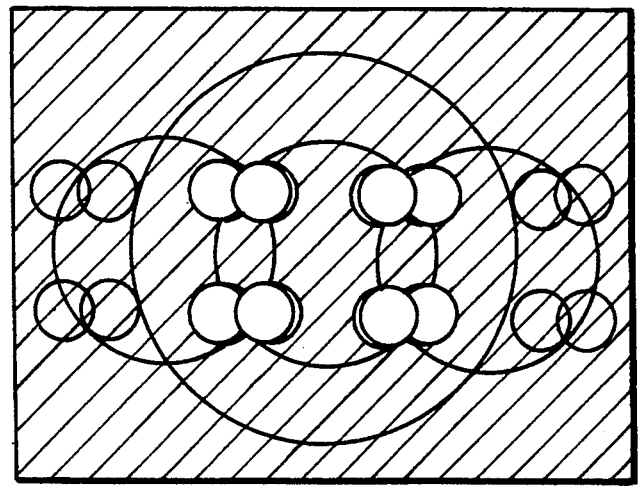

In the projection exposing apparatus shown in FIGS. 28 and 29, the photo-mask 18 has a precise shifter-light-shielding-type phase shift pattern 18f. In the foregoing projection exposing apparatus, the irradiation light beams passed from the aperture 14, which forms a second light source image as shown in FIG. 30a, are reflected upwardly by the half mirror 50 so that the photo-mask 18 is irradiated. The irradiation light beams are diffracted by the shifter-light-shielding-type phase shift pattern 18f the photo-mask 18 so that the pupil 51c of the second projection optical system 51 is irradiated. The light source image is formed into a shape as shown in FIG. 30b this time so that deformed irradiation is maintained. The irradiation light beams passed through the pupil 51c are reflected by the mirror 52, and then passed through the pupil 51c so that the photo-mask 18 is again irradiated. Since the irradiation light beams have been made to be deformed irradiation light beams at this time, the diffracted light beams diffracted by the precise shifter-light-shielding-type phase shift pattern 18f form a light source as shown in FIG. 30c on the pupil 19c of the first projection optical system 19. The irradiation light beams passed through the pupil 19c form an optical image 23f on the wafer 20. In the case of the precise shifter-light-shielding-type phase shift pattern, the depth of focus is enlarged if the deformed irradiation is performed as compared with the usual irradiation, the foregoing modification enables satisfactorily deep depth of focus to be obtained.

Figure 31:
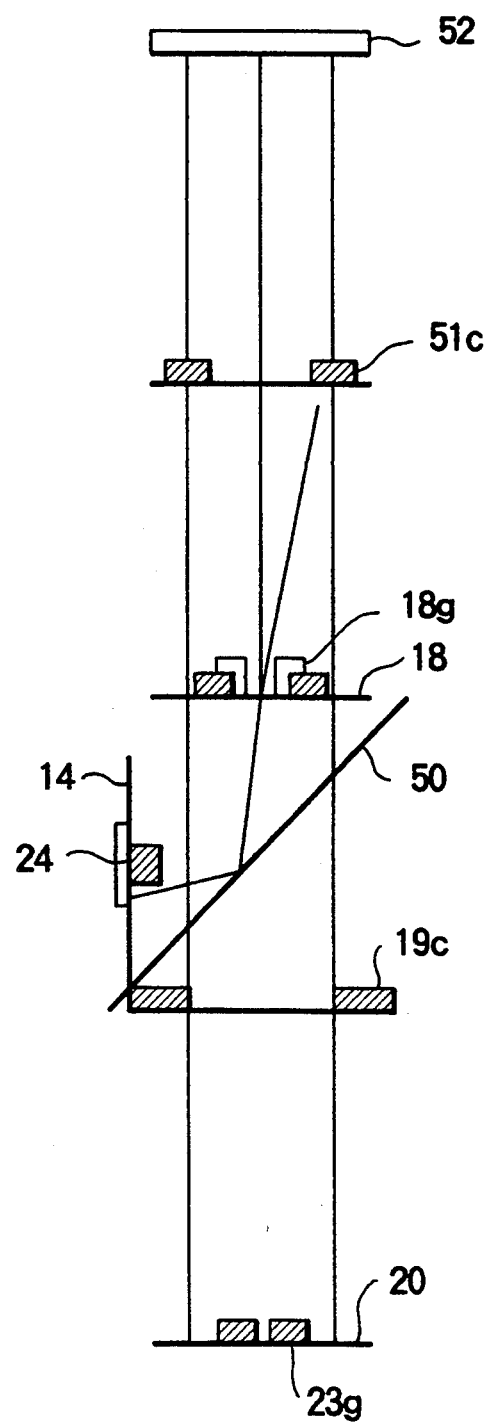
FIG. 31 illustrates a state where irradiation light beams passed from the aperture reach the mirror in a case where a self-alignment-type phase shift mask is employed in the projection exposing apparatus shown in FIG. 12.
Figure 32:
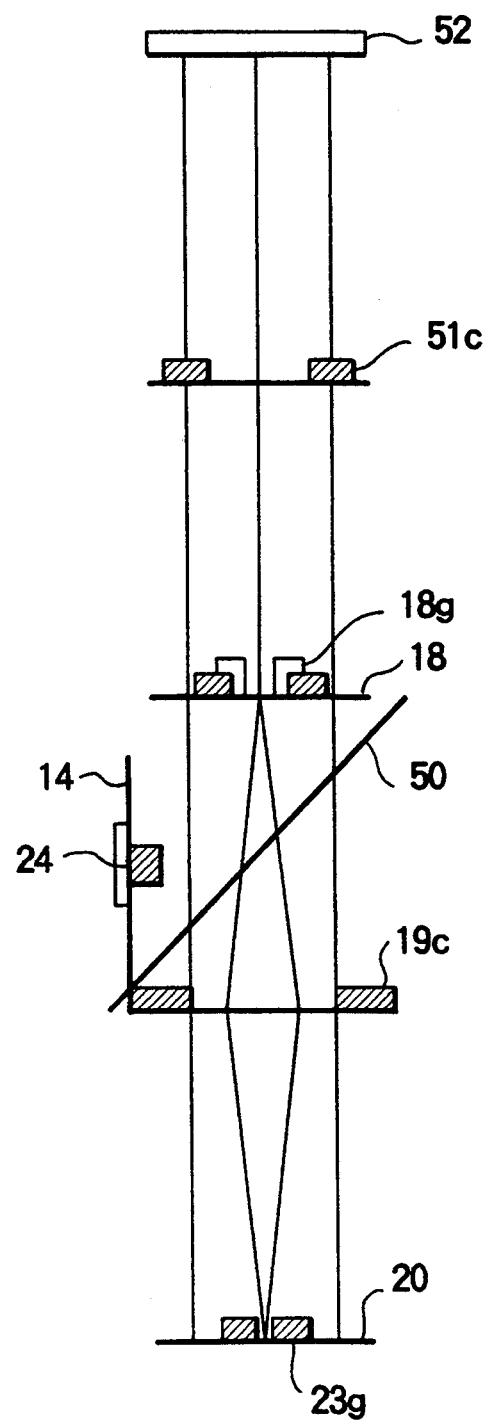
FIG. 32 illustrates a state where light beams reflected from the mirror reach the wafer in a case where the self-alignment-type phase shift mask is employed in the projection exposing apparatus shown in FIG. 12.
Figure 33A:
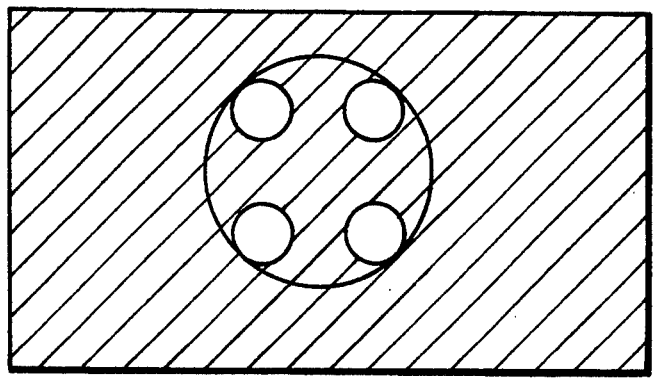
FIGS. 33a to 33c respectively illustrate light source images at the aperture, at the second projection lens pupil and at the first projection lens pupil in a case where the self-alignment-type phase shift mask is employed in the projection exposing apparatus shown in FIG. 12.
Figure 33B:
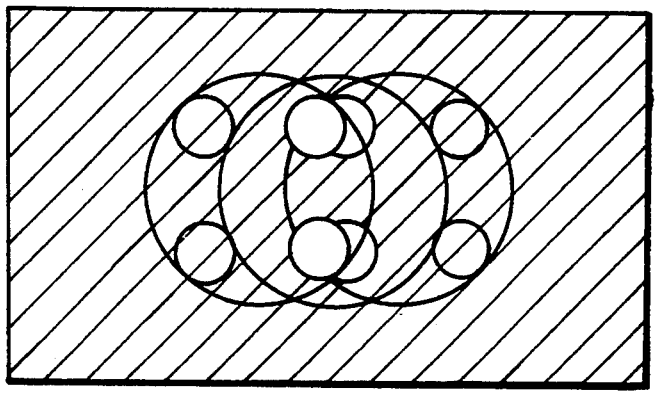
Figure 33C:
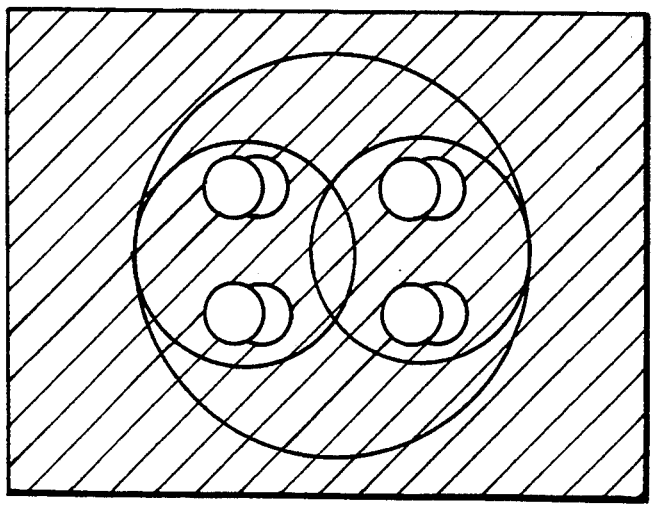

In the projection exposing apparatus shown in FIGS. 31 and 32, the photo-mask 18 has an isolated self-alignment-type phase shift pattern 18g. In the foregoing projection exposing apparatus, the irradiation light beams passed from the aperture 14, which forms a second light source image as shown in FIG. 33a, are reflected upwardly by the half mirror 50 so that the photo-mask 18 is irradiated. The irradiation light beams are diffracted by the self-alignment-type phase shift pattern 18g of the photo-mask 18 so that the pupil 51c of the second projection optical system 51 is irradiated. The light source image is formed into a shape shown in FIG. 33b at this time so that bisected irradiation is formed. The irradiation light beams passed through the pupil 51c are reflected by the mirror 52, and then passed through the pupil 51c so that the photo-mask 18 is again irradiated. Since the irradiation light beams are bisected irradiation light beams at this time, the diffracted light beams diffracted by the self-alignment-type phase shift pattern 18g form a light source image shown in FIG. 33c on the pupil 19c of the first projection optical system 19. The light beams passed through the pupil 19c form an optical image 23g on the wafer 20. In the case of the isolated self-alignment-type phase shift pattern, the depth of focus is enlarged if the bisected irradiation is performed. Therefore, the foregoing modification enables satisfactorily deep depth of focus to be obtained.

Figure 34:
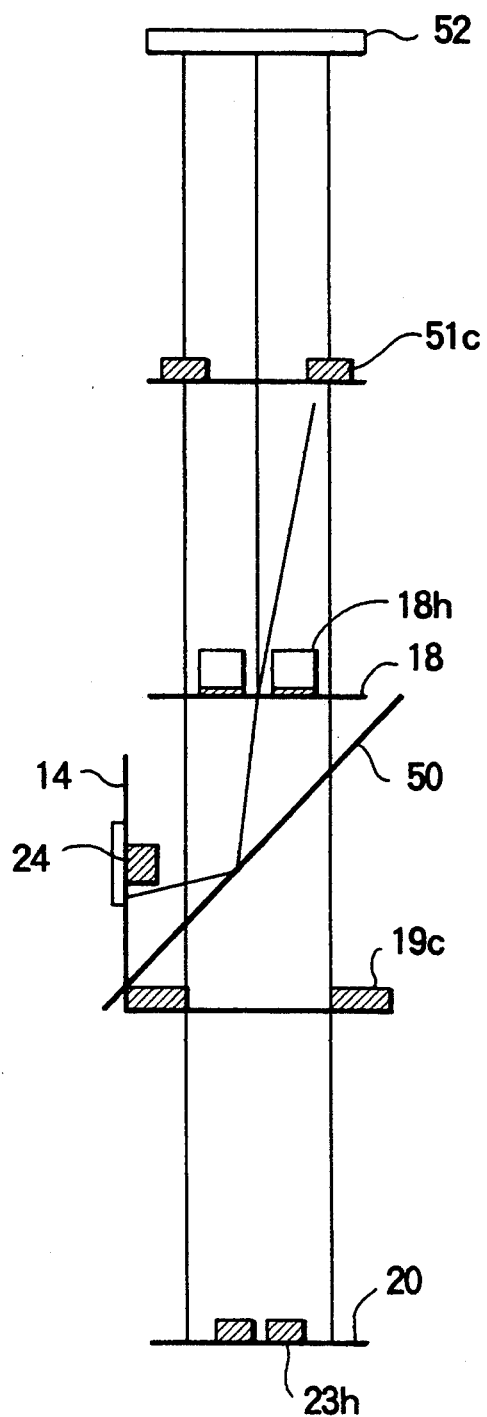
FIG. 34 illustrates a state where irradiation light beams passed from the aperture reach the mirror in a case where a half-tone-type phase shift mask is employed in the projection exposing apparatus shown in FIG. 12.
Figure 35:
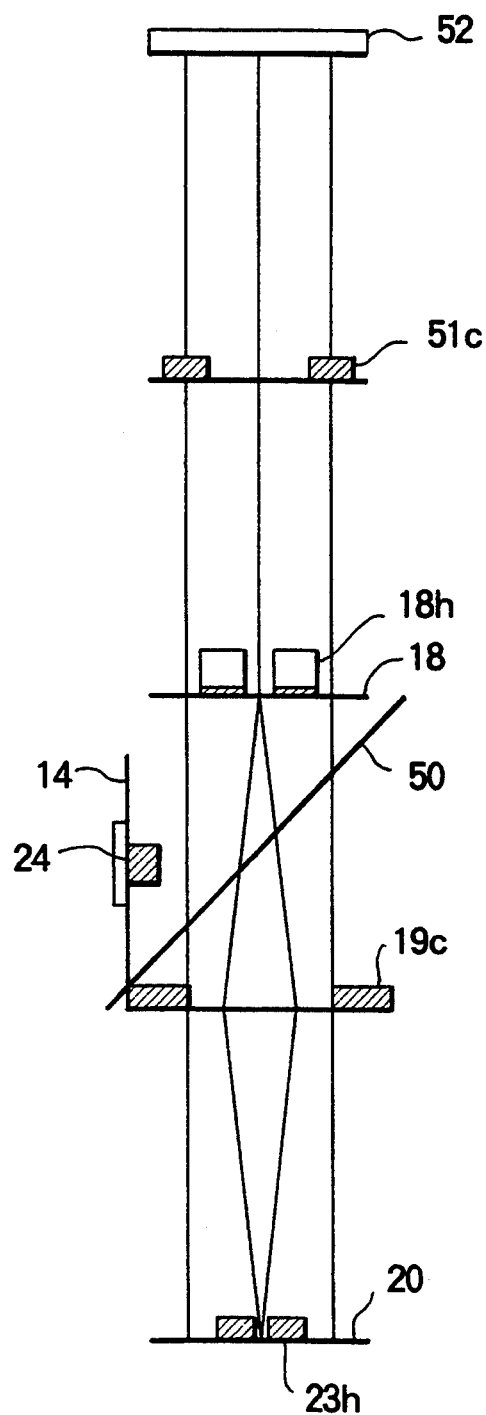
FIG. 35 illustrates a state where light beams reflected from the mirror reach the wafer in a case where the half-tone-type phase shift mask is employed in the projection exposing apparatus shown in FIG. 12.
Figure 36A:
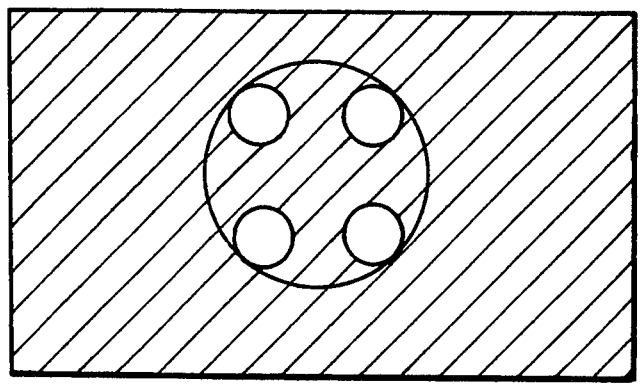
FIGS. 36a to 36c respectively illustrate light source images at the aperture, at the second projection lens pupil and at the first projection lens pupil in a case where the half-tone-type phase shift mask is employed in the projection exposing apparatus shown in FIG. 12.
Figure 36B:
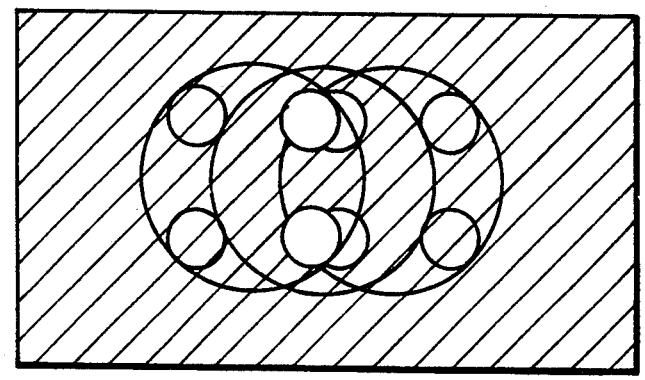
Figure 36C:
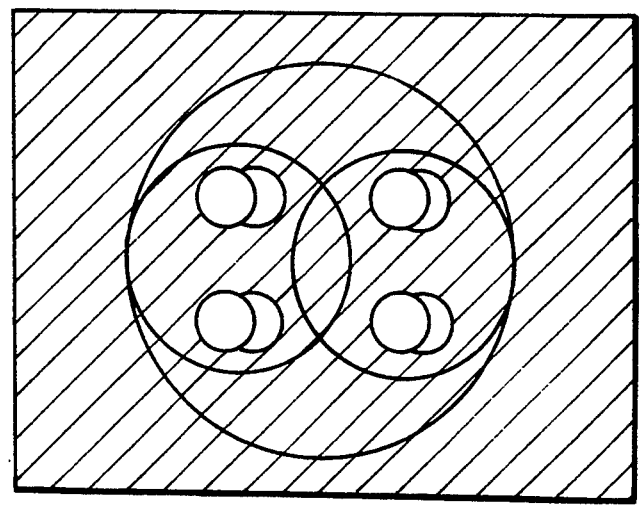
Figure 37:
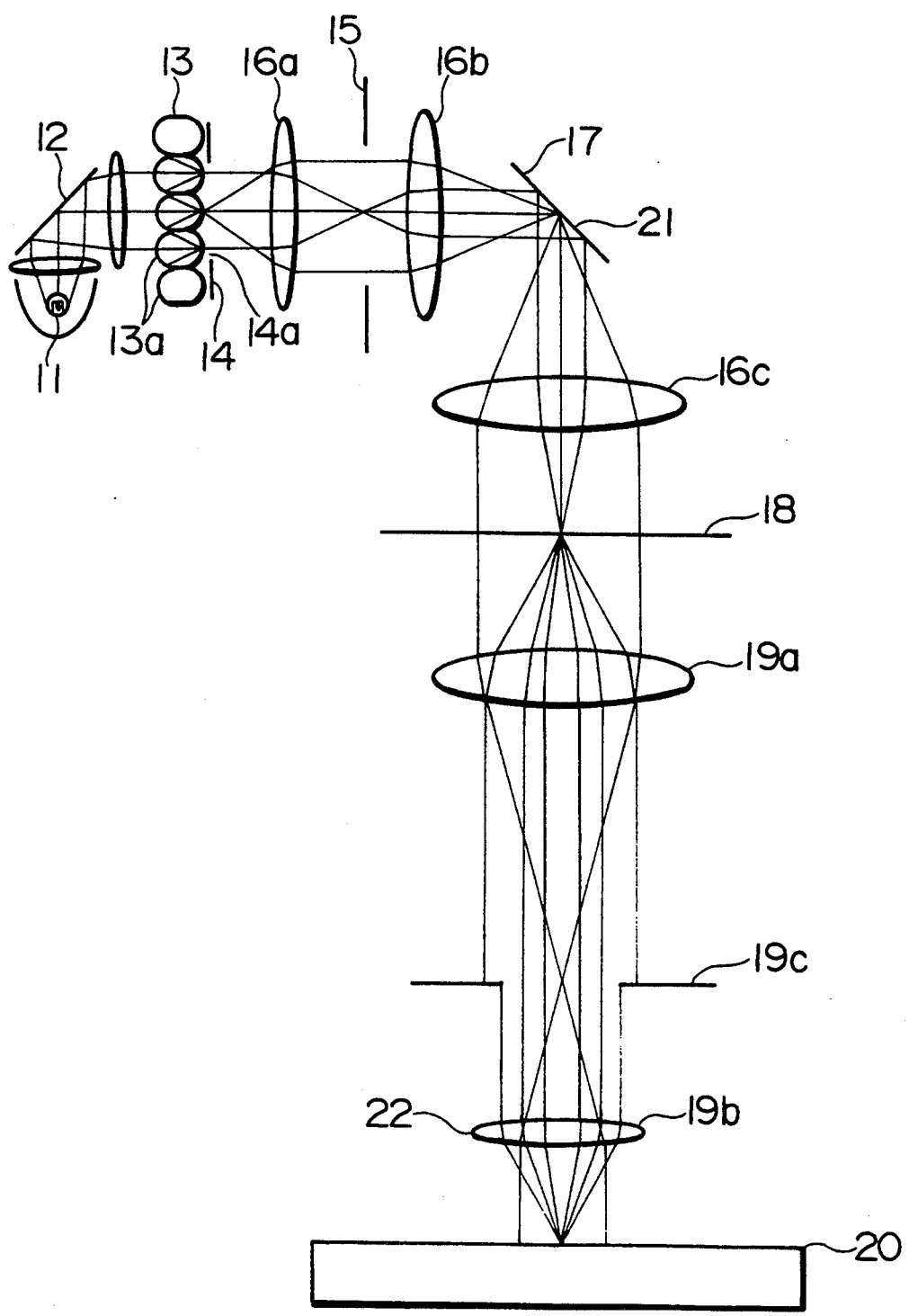
FIG. 37 is a schematic view which illustrates a conventional projection exposing apparatus.
Figure 38:
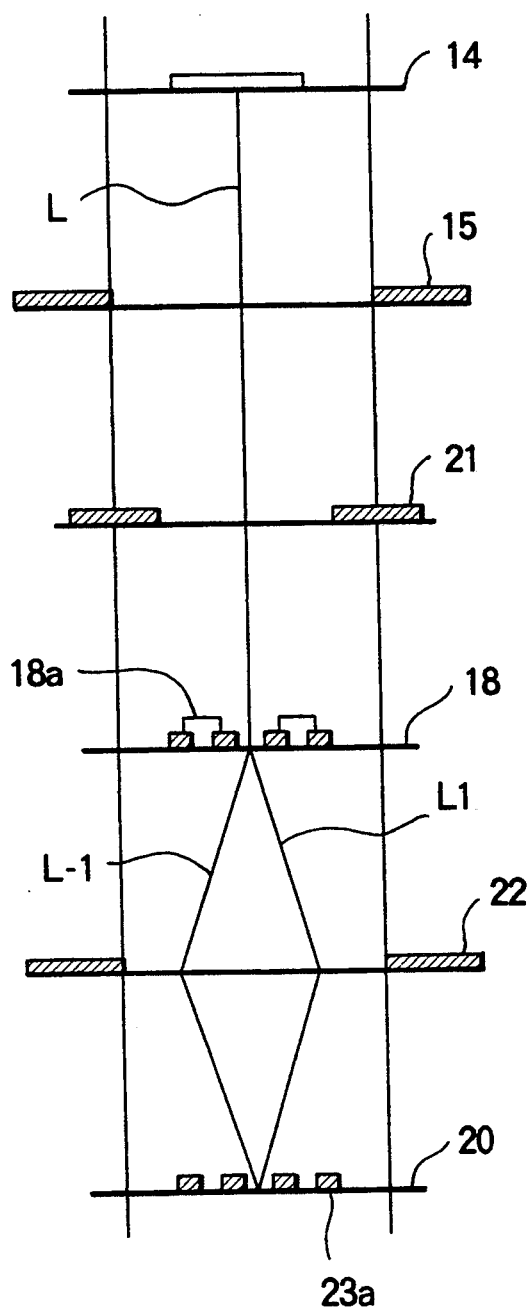
FIG. 38 is a schematic view which illustrates a state where usual irradiation and the Levenson-type phase shift mask are simultaneously employed in the projection exposing apparatus shown in FIG. 37.
Figure 39:
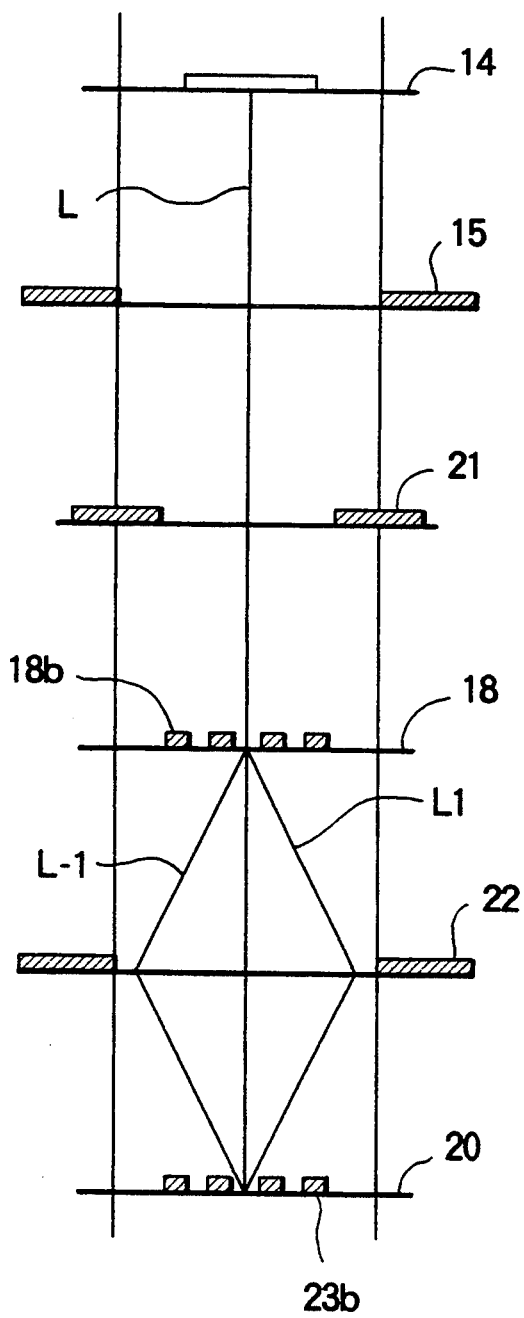
FIG. 39 is a schematic view which illustrates a state where usual irradiation and the usual mask having a precise pattern are simultaneously employed in the projection exposing apparatus shown in FIG. 37.
Figure 40:
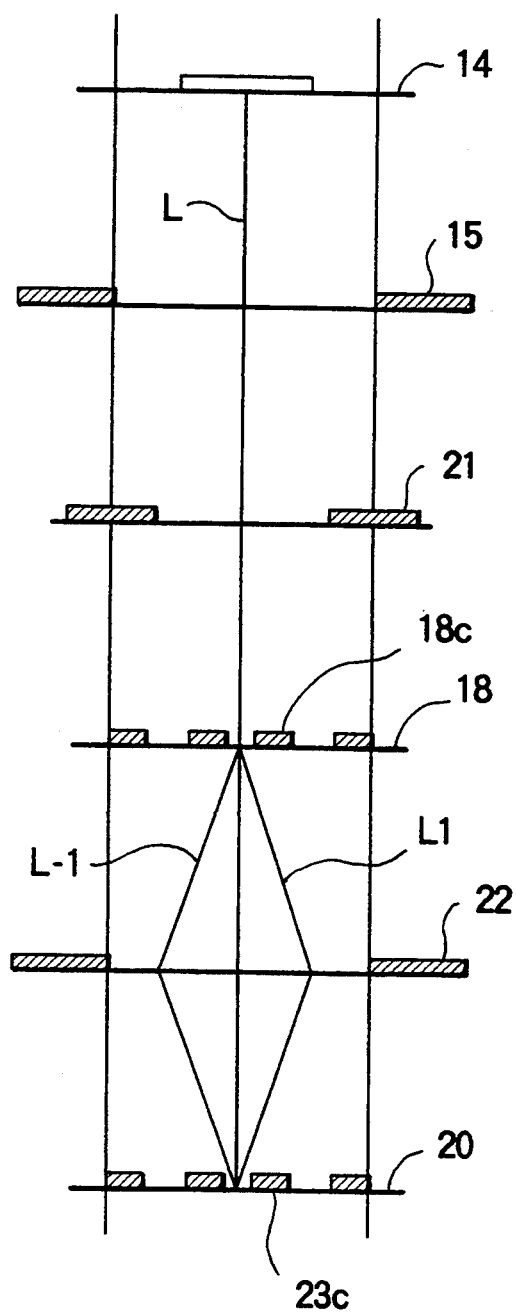
FIG. 40 is a schematic view which illustrates a state where usual irradiation and the usual mask having a coarse pattern are simultaneously employed in the projection exposing apparatus shown in FIG. 37.
Figure 41:
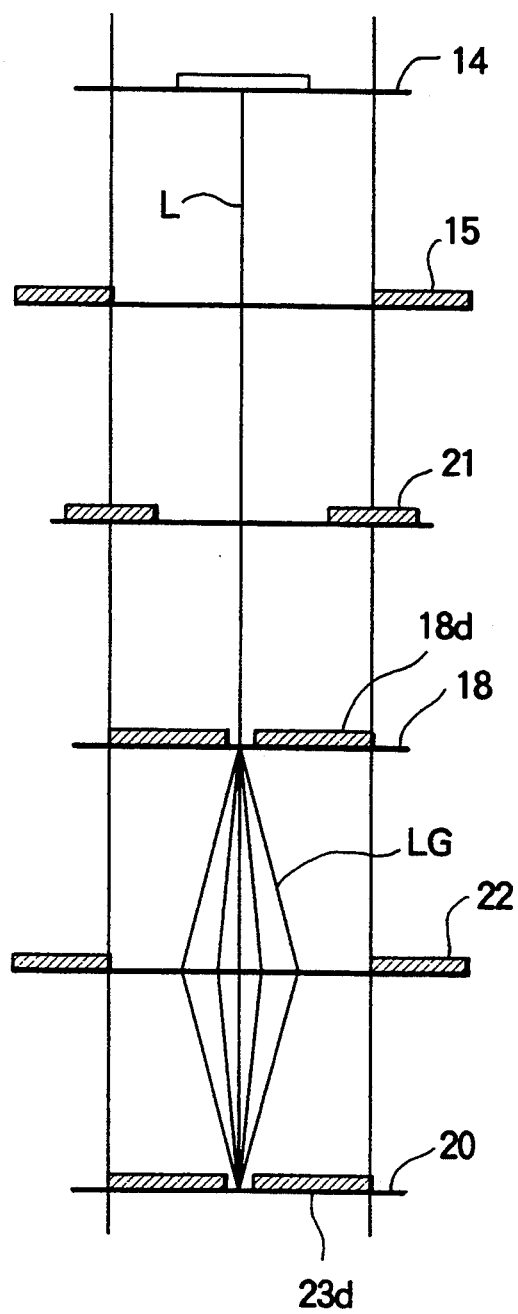
FIG. 41 is a schematic view which illustrates a state where usual irradiation and the usual mask having a isolated pattern are simultaneously employed in the projection exposing apparatus shown in FIG. 37.
Figure 42:
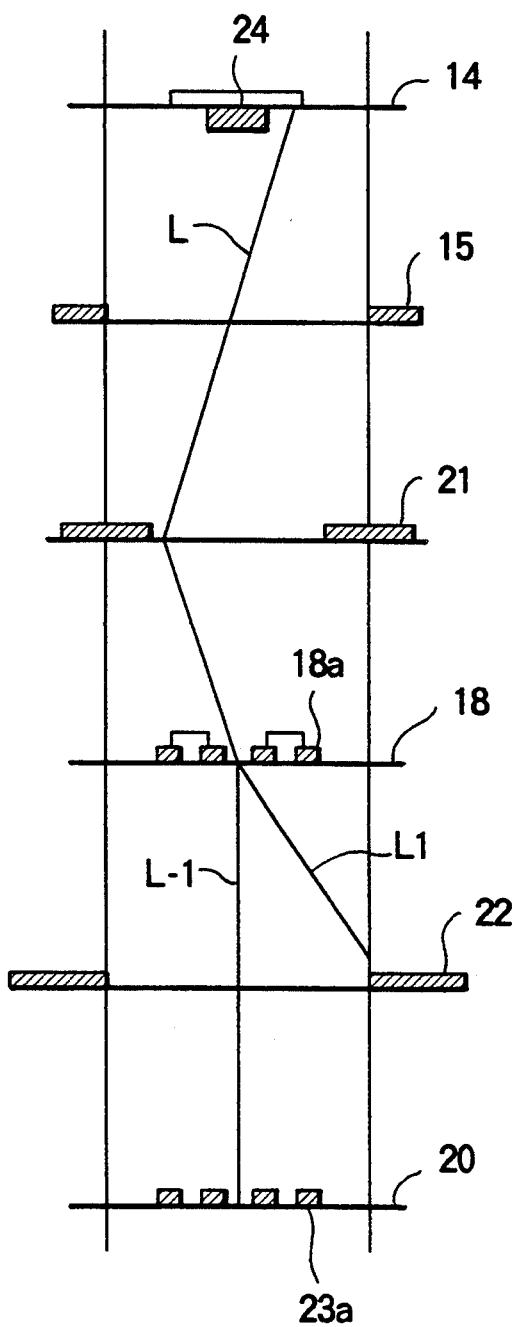
FIG. 42 is a schematic view which illustrates a state where deformed irradiation and the Levenson-type phase shift mask are simultaneously employed in the projection exposing apparatus shown in FIG. 37.
Figure 43:
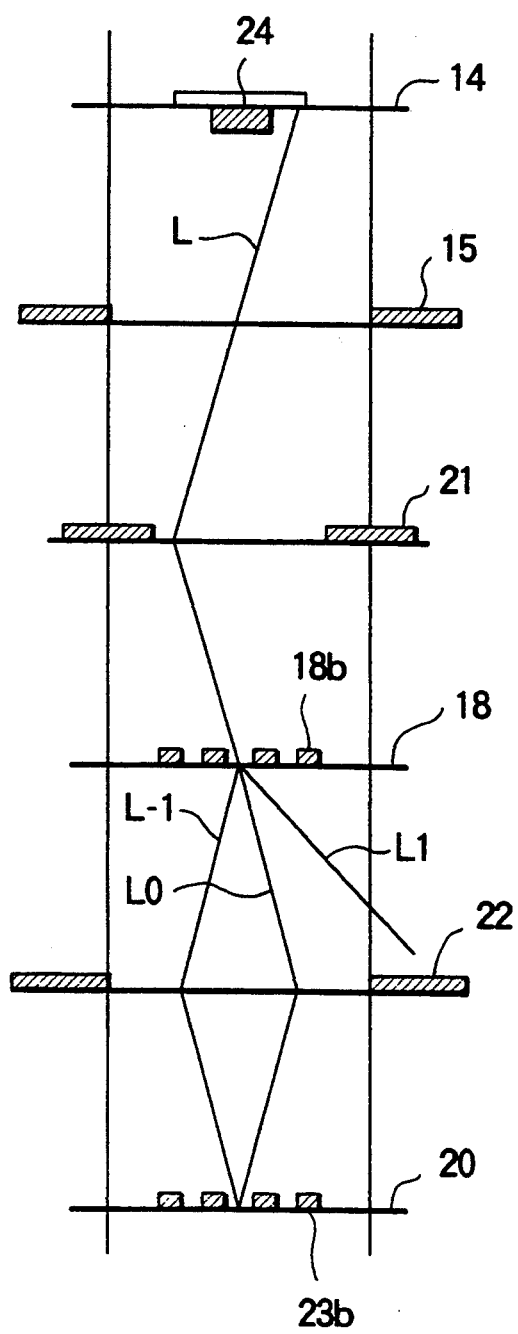
FIG. 43 is a schematic view which illustrates a state where deformed irradiation and the usual mask having a precise pattern are simultaneously employed in the projection exposing apparatus shown in FIG. 37.
Figure 44:
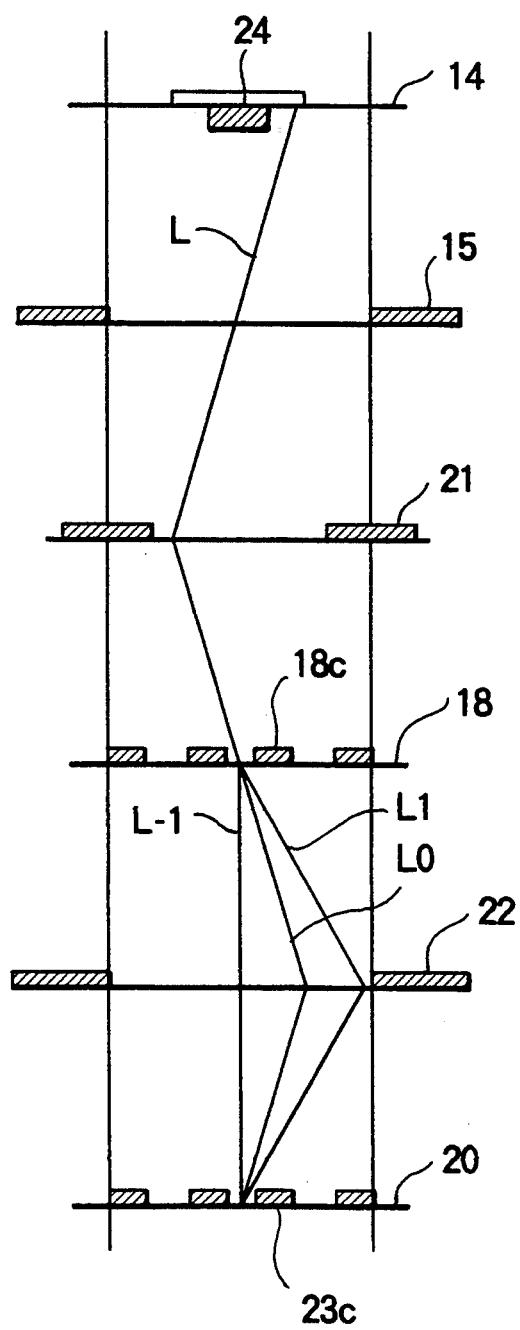
FIG. 44 is a schematic view which illustrates a state where deformed irradiation and the usual mask having a coarse pattern are simultaneously employed in the projection exposing apparatus shown in FIG. 37.
Figure 45:
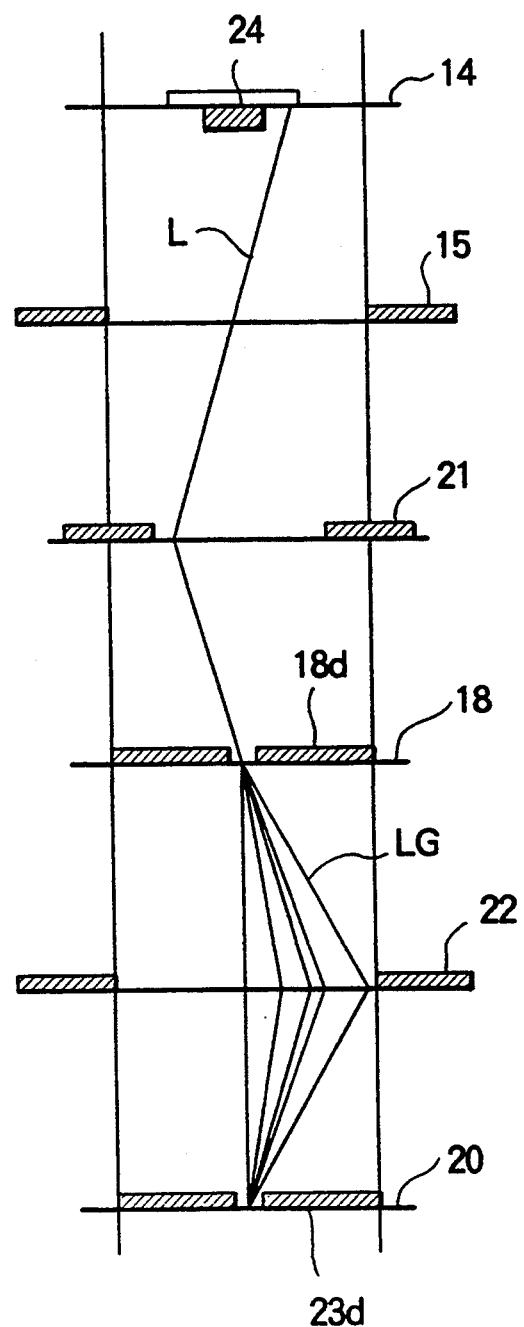
FIG. 45 is a schematic view which illustrates a state where deformed irradiation and the usual mask having a isolated pattern are simultaneously employed in the projection exposing apparatus shown in FIG. 37.

In the projection exposing apparatus shown in FIGS. 34 and 35, the photo-mask 18 has an isolated half-tone-type phase shift pattern 18h. In the foregoing projection exposing apparatus, the irradiation light beams passed from the aperture, which forms a second light source image as shown in FIG. 36a, are reflected upwardly by the half mirror 50 so that the photo-mask 18 is irradiated. The irradiation light beams are diffracted by the half-tone-type phase shift pattern 18h of the photo-mask 18 so that the pupil 51c of the second projection optical system 51 is irradiated. The light source image is formed into a shape as shown in FIG. 36b at this time so that bisected irradiation is formed. The irradiation light beams passed through the pupil 51c are reflected by the mirror 52, and then passed through the pupil 51c so that the photo-mask 18 is again irradiated. Since the irradiation light beams are formed into the bisected irradiation light beams at this time, the diffracted light beams diffracted by the half-tone-type phase shift pattern 18h form a light source image as shown in FIG. 36c on the pupil 19c of the first projection optical system 19. The light beams passed through the pupil 19c form an optical image 23h on the wafer 20. In the case of the isolated half-tone-type phase shift pattern, the depth of focus is enlarged if the bisected irradiation is used. Therefore, the foregoing modification enables satisfactorily deep depth of focus to be obtained.

Since the foregoing second embodiment has the arrangement that the irradiation light beams passed through the photo-mask 18 are reflected by the mirror and passed again through the photo-mask 18, the second photo-mask of a type employed in the first embodiment can be omitted from the structure. Further, optimum exposure can easily be performed.

What is claimed is:

1. A projection exposing apparatus comprising:
    a light source for producing light beams as a first light surface;
    a first aperture for shaping light beams supplied from said light source to form a second light source surface for producing deformed irradiation;
    a blind having an aperture for determining an exposure region of the light beams supplied from said second light source surface;
    a second aperture for shaping the light beams supplied from said second light source surface to form a third light source surface;
    a first photo-mask having a circuit pattern for irradiation with the light beams supplied from said third light source surface;
    a projection optical system for imaging onto a substrate to be exposed to light diffracted light beams passed through said first photo-mask to project the circuit pattern of said first photo-mask; and
    a second photo-mask having a pattern corresponding to the circuit pattern of said first photo-mask and disposed in the aperture of said blind.

2. The projection exposing apparatus as claimed in claim 1 wherein said second photo-mask has a circuit pattern which is the same as said circuit pattern of said first photo-mask.

3. The projection exposing apparatus as claimed in claim 1 wherein said second photo-mask has a circuit pattern, the circuit pattern of said second photo-mask having elements disposed at the same positions as corresponding elements of the circuit pattern of said first photo-mask and the dimension of each of the patterns being different.

4. The projection exposing apparatus as claimed in claim 1 wherein said first photo-mask and said second photo-mask respectively are Levenson phase shift masks.

5. The projection exposing apparatus as claimed in claim 1 wherein said first photo-mask and said second photo-mask respectively are sub-shifter phase shift masks.

6. The projection exposing apparatus as claimed in claim 1 wherein said first photo-mask and said second photo-mask respectively are shifter light-shielding phase shift masks.

7. The projection exposing apparatus as claimed in claim 1 wherein said first photo-mask and said second photo-mask respectively are self-alignment phase shift masks.

8. The projection exposing apparatus as claimed in claim 1 wherein said first photo-mask and said second photo-mask respectively are half-tone phase shift masks.

9. A projection exposing apparatus comprising:
    a light source for producing light beams as a first light surface;
    an aperture for shaping light beams supplied from said light source to form a second light source surface for producing deformed irradiation;
    a blind for determining an exposure region of light beams supplied from said second light source surface;
    a photo-mask having a circuit pattern and irradiated with the light beams supplied from said third light source surface;
    a first projection optical system for shaping diffracted light beams supplied from said photo-mask for irradiating said photo-mask with the diffracted light beams that have been shaped; and
    a second projection optical system for imaging light beams diffracted by said photo-mask onto a substrate to project the circuit pattern of said photo-mask.

10. The projection exposing apparatus according to claim 9 wherein said photo-mask is a Levenson phase shift mask.

11. The projection exposing apparatus according to claim 9 wherein said photo-mask is a sub-shifter phase shift mask.

12. The projection exposing apparatus according to claim 9 wherein said photo-mask is a shifter light-shielding phase shift mask.

13. The projection exposing apparatus according to claim 9 wherein said photo-mask is a self-alignment phase shift mask.

14. The projection exposing apparatus according to claim 9 wherein said photo-mask is a half-tone phase shift mask.

15. A projection exposing method comprising the steps of:

shaping irradiation light beams supplied from a source to form a second light source surface for generating deformed irradiation;

irradiating, with irradiation light beams supplied from said second light source surface, a second photo-mask having a pattern corresponding to a circuit pattern of a first photo-mask and disposed on a blind surface;

shaping said irradiation light beams shaped by said second photo-mask to form a third light source;

irradiating said first photo-mask with irradiation light beams supplied from said third light source surface; and imaging diffracted light beams passed from said first photo-mask onto a substrate to project the circuit pattern of said photo-mask.

16. The projection exposing method according to claim 15 including using a photo-mask having a circuit pattern that is the same as the circuit pattern of said first photo-mask.

17. The projection exposing method according to claim 15 including using a photo-mask having a circuit pattern including elements disposed at the same positions as but having different dimensions from corresponding elements of the circuit pattern of said first photo-mask to adjust the amount of exposure of each portion of said first photo-mask.

18. A projection exposing method comprising the steps of:

shaping irradiation light beams supplied from a light source to form a second light source surface for generating deformed irradiation;

irradiating, with irradiation light beams supplied from said second light source surface, a photo-mask having a circuit pattern;

shaping diffracted light beams passed through said photo-mask and again irradiating said photo-mask with said diffracted light beams that have been shaped; and imaging light beams again diffracted by said photo-mask onto a substrate to project the circuit pattern of said photo-mask.

* * * * *

UNITED STATES PATENT AND TRADEMARK OFFICE
CERTIFICATE OF CORRECTION

PATENT NO. : 5,367,358
DATED : NOVEMBER 22, 1994
INVENTOR(S) : KAZUYA KAMON

It is certified that error appears in the above-indentified patent and that said Letters Patent is hereby corrected as shown below:

TITLE PAGE:

In Item [57] ABSTRACT, line 6, insert --.-- after "substrate";

Column 19, line 16, after "a" insert --light--;
Column 20, line 3, after "said" insert --first--;
Column 20, line 24, change "said" to --the--;
Column 20, line 25, change "said" to --the--.

Signed and Sealed this

Seventh Day of March, 1995

Attest:

BRUCE LEHMAN

Attesting Officer    Commissioner of Patents and Trademarks